US011695270B2

(12) United States Patent
Rochford et al.

(10) Patent No.: US 11,695,270 B2
(45) Date of Patent: Jul. 4, 2023

(54) SYSTEMS AND METHODS FOR AUXILIARY POWER DROPOUT PROTECTION

(71) Applicant: WiTricity Corporation, Watertown, MA (US)

(72) Inventors: Conor Rochford, Newton, MA (US); Milisav Danilovic, Watertown, MA (US)

(73) Assignee: WiTricity Corporation, Watertown, MA (US)

( * ) Notice: Subject to any disclaimer, the term of this patent is extended or adjusted under 35 U.S.C. 154(b) by 133 days.

(21) Appl. No.: 17/161,479

(22) Filed: Jan. 28, 2021

(65) Prior Publication Data

US 2021/0234365 A1    Jul. 29, 2021

Related U.S. Application Data

(60) Provisional application No. 63/036,975, filed on Jun. 9, 2020, provisional application No. 62/967,328, filed on Jan. 29, 2020.

(51) Int. Cl.
*H02H 7/20* (2006.01)
*H02H 1/00* (2006.01)
(Continued)

(52) U.S. Cl.
CPC ............ *H02H 7/20* (2013.01); *H02H 1/0007* (2013.01); *H02H 7/125* (2013.01); *H02M 1/08* (2013.01);
(Continued)

(58) Field of Classification Search
CPC .... H02H 1/0007; H02H 1/003; H02H 1/0063; H02H 7/125; H02H 7/1255;
(Continued)

(56) References Cited

U.S. PATENT DOCUMENTS 5,640,082 A    6/1997 Lusher et al.
5,757,599 A *  5/1998 Crane .................... H03K 17/18
                                                       307/130
(Continued)

FOREIGN PATENT DOCUMENTS

CN    103414255 A    11/2013
CN    110103742 A     8/2019
(Continued)

OTHER PUBLICATIONS

International Search Report—International Application No. PCT/US2017/048481, dated Dec. 6, 2017, together with the Written Opinion of the International Searching Authority, 11 pages.
(Continued)

*Primary Examiner* — Nguyen Tran
(74) *Attorney, Agent, or Firm* — Goodwin Procter LLP

(57) ABSTRACT

The disclosure features circuits and methods for protecting transistors of a wireless power receiver, which can be controlled by gate drivers powered by an auxiliary power source. The circuit can include a comparator configured to generate a signal indicating a comparison of a value of the auxiliary power source to a predetermined threshold, and a fault latch coupled to the comparator. The fault latch can be configured to trigger based on the generated signal and transmit a signal to respective inputs of the gate drivers to cause a latched-on state of respective gates of the transistors. Switches respectively coupled to the gate drivers can be configured to disconnect respective outputs of the gate drivers from the respective transistor gates. Gate hold-up circuits respectively coupled to the respective transistor gates can be configured to maintain the latched-on state of the respective transistor gates for a period of time.

20 Claims, 25 Drawing Sheets

(51) Int. Cl.
    *H02M 1/08*    (2006.01)
    *H02M 7/06*    (2006.01)
    *H02H 7/125*    (2006.01)
    *H02J 50/12*    (2016.01)
    *H02J 7/02*    (2016.01)

(52) U.S. Cl.
    CPC ................ *H02M 7/06* (2013.01); *H02J 7/02* (2013.01); *H02J 50/12* (2016.02)

(58) Field of Classification Search
    CPC .......... H02H 7/1257; H02H 7/18; H02H 7/20; H02H 7/205; H02H 7/122
    See application file for complete search history.

(56) References Cited

U.S. PATENT DOCUMENTS

| | | |
|---|---|---|
| 5,784,269 A | 7/1998 | Jacobs et al. |
| 6,037,745 A | 3/2000 | Koike et al. |
| 6,483,730 B2 | 11/2002 | Johnson, Jr. |
| 7,276,886 B2 | 10/2007 | Kinder et al. |
| 7,333,349 B2 | 2/2008 | Chang et al. |
| 7,440,300 B2 | 10/2008 | Konishi et al. |
| 7,535,133 B2 | 5/2009 | Perreault et al. |
| 8,830,710 B2 | 9/2014 | Perreault et al. |
| 9,461,714 B2 | 10/2016 | Cook et al. |
| 9,782,092 B2 | 10/2017 | Zhang |
| 9,853,564 B2 | 12/2017 | Kang et al. |
| 10,027,186 B2 | 7/2018 | Aikawa et al. |
| 10,076,966 B2 | 9/2018 | Koizumi et al. |
| 10,090,885 B2 | 10/2018 | Widmer et al. |
| 10,141,788 B2 | 11/2018 | Karnstedt et al. |
| 10,218,224 B2 | 2/2019 | Campanella et al. |
| 10,343,535 B2 | 7/2019 | Cook et al. |
| 10,418,841 B2 | 9/2019 | Danilovic et al. |
| 10,461,587 B2 | 10/2019 | Sieber |
| 10,651,688 B2 | 5/2020 | Karnstedt et al. |
| 10,673,282 B2 | 6/2020 | Campanella et al. |
| 11,017,942 B2 | 5/2021 | Rochford et al. |
| 2003/0169027 A1 | 9/2003 | Croce et al. |
| 2007/0064457 A1 | 3/2007 | Perreault et al. |
| 2007/0222542 A1 | 9/2007 | Joannopoulos et al. |
| 2008/0265995 A1 | 10/2008 | Okamoto et al. |
| 2008/0278264 A1 | 11/2008 | Karalis et al. |
| 2010/0141042 A1 | 6/2010 | Kesler et al. |
| 2010/0237709 A1 | 9/2010 | Hall et al. |
| 2010/0277006 A1 | 11/2010 | Urciuoli |
| 2010/0295506 A1 | 11/2010 | Ichikawa |
| 2011/0074346 A1 | 3/2011 | Hall et al. |
| 2011/0116290 A1 | 5/2011 | Boys |
| 2011/0193416 A1 | 8/2011 | Campanella et al. |
| 2011/0196544 A1 | 8/2011 | Baarman et al. |
| 2011/0260865 A1 | 10/2011 | Bergman et al. |
| 2012/0112535 A1 | 5/2012 | Karalis et al. |
| 2012/0139358 A1 | 6/2012 | Teggatz et al. |
| 2012/0287545 A1* | 11/2012 | Tran .................. H03K 17/0822 361/101 |
| 2013/0020863 A1 | 1/2013 | Sugiyama et al. |
| 2013/0062966 A1 | 3/2013 | Verghese et al. |
| 2013/0069441 A1 | 3/2013 | Verghese et al. |
| 2013/0181724 A1 | 7/2013 | Teggatz et al. |
| 2014/0035704 A1 | 2/2014 | Efe et al. |
| 2014/0049118 A1 | 2/2014 | Karalis et al. |
| 2014/0091634 A1 | 4/2014 | Mayo et al. |
| 2014/0111019 A1 | 4/2014 | Roy et al. |
| 2014/0152117 A1 | 6/2014 | Sankar |
| 2014/0265610 A1 | 9/2014 | Bakker et al. |
| 2014/0292092 A1 | 10/2014 | Ichinose et al. |
| 2014/0361636 A1 | 12/2014 | Endo et al. |
| 2014/0368052 A1 | 12/2014 | Norconk et al. |
| 2015/0035372 A1 | 2/2015 | Aioanei |
| 2015/0051750 A1 | 2/2015 | Kurs et al. |
| 2015/0055262 A1 | 2/2015 | Lin |
| 2015/0061578 A1 | 3/2015 | Keeling et al. |
| 2015/0202970 A1 | 7/2015 | Huang et al. |
| 2015/0244179 A1 | 8/2015 | Ritter et al. |
| 2015/0260835 A1 | 9/2015 | Widmer et al. |
| 2015/0303703 A1 | 10/2015 | Hayashi et al. |
| 2015/0306963 A1 | 10/2015 | Van Wiemeersch et al. |
| 2015/0318708 A1 | 11/2015 | Bartlett |
| 2015/0319838 A1 | 11/2015 | Bhutta |
| 2015/0323694 A1 | 11/2015 | Roy et al. |
| 2015/0357826 A1 | 12/2015 | Yoo et al. |
| 2015/0372516 A1 | 12/2015 | Na et al. |
| 2016/0006289 A1 | 1/2016 | Sever et al. |
| 2016/0079766 A1 | 3/2016 | Jeong et al. |
| 2016/0084894 A1 | 3/2016 | Govindaraj et al. |
| 2016/0187519 A1 | 6/2016 | Widmer et al. |
| 2016/0218566 A1 | 7/2016 | Bunsen et al. |
| 2016/0248243 A1* | 8/2016 | Yanagishima ......... H02H 3/087 |
| 2016/0248275 A1 | 8/2016 | Okidan |
| 2016/0254679 A1 | 9/2016 | Liu et al. |
| 2016/0294221 A1 | 10/2016 | Maniktala |
| 2016/0308393 A1 | 10/2016 | Kumar et al. |
| 2016/0380555 A1 | 12/2016 | Kang et al. |
| 2017/0093168 A1 | 3/2017 | Von Novak, III et al. |
| 2017/0104365 A1 | 4/2017 | Ghosh et al. |
| 2017/0117751 A1 | 4/2017 | Karnstedt et al. |
| 2017/0126069 A1 | 5/2017 | Martin |
| 2017/0141622 A1 | 5/2017 | Meichle |
| 2017/0217325 A1 | 8/2017 | DeBaun et al. |
| 2017/0229917 A1 | 8/2017 | Kurs et al. |
| 2017/0256991 A1 | 9/2017 | Bronson et al. |
| 2017/0324351 A1 | 11/2017 | Rochford |
| 2017/0346343 A1 | 11/2017 | Atasoy et al. |
| 2017/0346345 A1 | 11/2017 | Kurs et al. |
| 2017/0358953 A1 | 12/2017 | Trudeau et al. |
| 2018/0006566 A1 | 1/2018 | Bronson et al. |
| 2018/0040416 A1 | 2/2018 | Lestoquoy |
| 2018/0056800 A1 | 3/2018 | Meichle |
| 2018/0062421 A1 | 3/2018 | Danilovic et al. |
| 2018/0090995 A1 | 3/2018 | Arasaki et al. |
| 2018/0236879 A1 | 8/2018 | Elshaer et al. |
| 2018/0358844 A1 | 12/2018 | Yu et al. |
| 2019/0006888 A1 | 1/2019 | Hajimiri et al. |
| 2019/0103767 A1 | 4/2019 | Lethellier |
| 2019/0103771 A1 | 4/2019 | Piasecki et al. |
| 2019/0115837 A1 | 4/2019 | Fahlenkamp et al. |
| 2019/0148986 A1 | 5/2019 | Yoo et al. |
| 2019/0165611 A1 | 5/2019 | Miyazawa et al. |
| 2019/0326743 A1 | 10/2019 | Govindaraj |
| 2019/0341796 A1 | 11/2019 | Gu et al. |
| 2020/0161901 A1 | 5/2020 | Tombelli |
| 2020/0195164 A1 | 6/2020 | Zhan et al. |
| 2020/0303926 A1 | 9/2020 | Yang |
| 2020/0343715 A1* | 10/2020 | Kaeriyama ............ G01R 31/40 |
| 2020/0359468 A1 | 11/2020 | Jung et al. |
| 2020/0381945 A1 | 12/2020 | Wang et al. |
| 2021/0088567 A1 | 3/2021 | Guedon et al. |
| 2021/0281099 A1 | 9/2021 | Wan |
| 2021/0281112 A1 | 9/2021 | Danilovic et al. |
| 2022/0255358 A1 | 8/2022 | Mao et al. |

FOREIGN PATENT DOCUMENTS

| | | |
|---|---|---|
| DE | 102014208991 A1 | 11/2014 |
| EP | 0609964 A2 | 8/1994 |
| EP | 2763279 A1 | 8/2014 |
| EP | 2947749 A1 | 11/2015 |
| EP | 3145047 A1 | 3/2017 |
| EP | 3203634 A1 | 8/2017 |
| EP | 3248270 A1 | 11/2017 |
| EP | 3407467 A1 | 11/2018 |
| GB | 1506633 A | 4/1978 |
| JP | H11127580 A | 5/1999 |
| JP | 5635215 B1 | 12/2014 |
| JP | 2015208150 A | 11/2015 |
| JP | 2015231306 A | 12/2015 |
| JP | 2016131447 A | 7/2016 |
| JP | 2018102054 A | 6/2018 |
| KR | 20170118573 A | 10/2017 |
| WO | WO-2001018936 A1 | 3/2001 |
| WO | WO-2013036947 A2 | 3/2013 |
| WO | WO-2015119511 A1 | 8/2015 |

(56) References Cited

FOREIGN PATENT DOCUMENTS

| WO | WO-2016099806 A1 | 6/2016 |
|---|---|---|
| WO | WO-2017070009 A1 | 4/2017 |
| WO | WO-2018136885 A1 | 7/2018 |

OTHER PUBLICATIONS

International Search Report—International Application No. PCT/US2021/021209, dated Aug. 17, 2021, together with the Written Opinion of the International Searching Authority, 17 pages.

International Search Report and the Written Opinion of the International Searching Authority, PCT/US2017/033997, 9 pages, dated Sep. 12, 2017.

International Search Report and Written Opinion for PCT/US2019/059441 dated Feb. 18, 2020, 11 pages.

International Search Report and Written Opinion for PCT/US2019/063616 dated Mar. 11, 2020, 9 pages.

International Search Report and Written Opinion for PCT/US2020/034344 dated Oct. 28, 2020, 15 pages.

International Search Report and Written Opinion for PCT/US2020/048046 dated Oct. 8, 2020, 10 pages.

International Search Report—International Application No. PCT/US2017/054055 dated Dec. 21, 2017, together with the Written Opinion of the International Searching Authority, 12 pages.

Rivas, et al., Design Considerations for Very High Freguency dc-dc Converters, 37th IEEE Power Electronics Specialists Conference, Jun. 18-22, 2006, 11 pages, Jeju, Korea.

Rivas, et al., New Architectures for Radio-Freguency dc/dc Power Conversion, 2004 35th Annual IEEE Power Electronics Specialists Conference, 2004, 11 pages, Aachen, Germany.

International Search Report and the Written Opinion of the International Searching Authority, PCT/US2021/015452, 11 pages, dated May 19, 2021.

\* cited by examiner

| # | LOGIC INPUTS 802 | | | | | | LOGIC OUTPUTS 804 | | | |
|---|---|---|---|---|---|---|---|---|---|---|
| | PRI UVLO | SEC UVLO | HW ENABLE | SW ENABLE | PWMA | PWMB | PRE-PWMA | PRE-PWMB | POST-PWMA | POST-PWMB |
| 1 | 0 | 0 | 0 | 0 | 0 OR 1 | 0 OR 1 | 0 | 0 | 1 | 1 |
| 2 | 0 | 0 | 0 | 1 | 0 OR 1 | 0 OR 1 | 0 | 0 | 1 | 1 |
| 3 | 0 | 0 | 1 | 0 | 0 OR 1 | 0 OR 1 | 0 | 0 | 1 | 1 |
| 4 | 0 | 0 | 1 | 1 | 0 OR 1 | 0 OR 1 | 0 | 0 | 1 | 1 |
| 5 | 0 | 1 | 0 | 0 | 0 OR 1 | 0 OR 1 | 0 | 0 | 1 | 1 |
| 6 | 0 | 1 | 0 | 1 | 0 OR 1 | 0 OR 1 | 0 | 0 | 1 | 1 |
| 7 | 0 | 1 | 1 | 0 | 0 OR 1 | 0 OR 1 | 0 | 0 | 1 | 1 |
| 8 | 0 | 1 | 1 | 1 | 0 OR 1 | 0 OR 1 | 0 | 0 | 1 | 1 |
| 9 | 1 | 0 | 0 | 0 | 0 OR 1 | 0 OR 1 | 0 | 0 | 1 | 1 |
| 10 | 1 | 0 | 0 | 1 | 0 OR 1 | 0 OR 1 | 0 | 0 | 1 | 1 |
| 11 | 1 | 0 | 1 | 0 | 0 OR 1 | 0 OR 1 | 0 | 0 | 1 | 1 |
| 12 | 1 | 0 | 1 | 1 | 0 OR 1 | 0 OR 1 | 0 | 0 | 1 | 1 |
| 13 | 1 | 1 | 0 | 0 | 0 OR 1 | 0 OR 1 | 0 | 0 | 1 | 1 |
| 14 | 1 | 1 | 0 | 1 | 0 OR 1 | 0 OR 1 | 0 | 0 | 1 | 1 |
| 15 | 1 | 1 | 1 | 0 | 0 OR 1 | 0 OR 1 | 0 | 0 | 1 | 1 |
| 16 | 1 | 1 | 1 | 1 | 0 | 0 | 1 | 1 | 0 | 0 |
| 17 | 1 | 1 | 1 | 1 | 0 | 1 | 1 | 0 | 0 | 1 |
| 18 | 1 | 1 | 1 | 1 | 1 | 0 | 0 | 1 | 1 | 0 |
| 19 | 1 | 1 | 1 | 1 | 1 | 1 | 0 | 0 | 1 | 1 |

FIG. 8

SYSTEMS AND METHODS FOR AUXILIARY POWER DROPOUT PROTECTION

CROSS-REFERENCE TO RELATED APPLICATIONS

This application claims priority to U.S. Provisional Application No. 62/967,328 filed Jan. 29, 2020 and titled "SYSTEMS AND METHODS FOR AUXILIARY POWER DROPOUT PROTECTION" and U.S. Provisional Application No. 63/036,975 filed Jun. 9, 2020 and titled "GATE DRIVER IMPLEMENTATIONS FOR SAFE WIRELESS POWER SYSTEM OPERATION", each of which is incorporated by reference herein in its entirety.

TECHNICAL FIELD

The following disclosure is directed to methods and systems for protecting one or more components of a wireless power system and, more specifically, methods and systems for operating one or more gate drivers of a wireless power receiver in various failure modes.

BACKGROUND

Wireless power receivers or components thereof can be susceptible to various failure modes. For example, auxiliary power sources can be used to provide a separate voltage or current source from the main source to components of electronic systems. In another example, auxiliary power sources can be used to provide voltage to active components, e.g., transistors, used in complex electronic systems. In some instances, an auxiliary power source may drop out, thereby causing a failure mode in the wireless power system.

SUMMARY

In one aspect, the disclosure features a method for protecting one or more components of a wireless power receiver comprising one or more transistors configured to be controlled by respective one or more gate drivers. The gate drivers can be configured to be powered by an auxiliary power source. The method can include generating, by a comparator, a signal indicating a comparison of a value of the auxiliary power source to a predetermined threshold; triggering a fault latch based on the generated signal, the triggering comprising transmitting a signal to respective inputs of the gate drivers to cause a latched-on state of respective gates of the one or more transistors; disconnecting, by one or more switches respectively coupled to the one or more gate drivers, respective outputs of the gate drivers from the respective transistor gates; and maintaining, by one or more gate hold-up circuits respectively coupled to the transistor gates, the latched-on state of the respective transistor gates for a period of time.

Various embodiments of the example method can include one or more of the following features. The period of time can at least partially overlap with a duration associated with a voltage induced on a resonator of the wireless power receiver. The auxiliary power source can be a voltage source. The period of time can at least partially overlap with a duration in which the value of the auxiliary power source is zero volts. The one or more gate drivers can be configured to drive the respective transistor gates of a tunable matching network of the wireless power receiver. The one or more gate drivers can be configured to drive the respective transistor gates of a protection circuit coupled to a rectifier input or a rectifier output of the wireless power receiver. The value of the auxiliary power source can be a voltage value. The signal can indicate whether the value of the auxiliary power source is above or below the predetermined threshold. The one or more gate hold-up circuits can each include at least one pull-up resistor. The one or more gate hold-up circuits can each include at least one capacitor having a capacitance value based on the period of time. The period can be 2 seconds or less.

In another aspect, the disclosure features a protection circuit for one or more components of a wireless power receiver. The one or more components can include one or more transistors configured to be controlled by respective gate drivers. The gate drivers can be configured to be powered by an auxiliary power source. The circuit can include a comparator configured to generate a signal indicating a comparison of a value of the auxiliary power source to a predetermined threshold, and a fault latch coupled to the comparator. The fault latch can be configured to trigger based on the generated signal and transmit a signal to respective inputs of the gate drivers to cause a latched-on state of respective gates of the one or more transistors. The circuit can include one or more switches respectively coupled to the one or more gate drivers and configured to disconnect respective outputs of the gate drivers from the respective transistor gates, and one or more gate hold-up circuits respectively coupled to the transistor gates and configured to maintain the latched-on state of the respective transistor gates for a period of time.

Various embodiments of the example protection circuit can include one or more of the following features. The period of time can at least partially overlap with a duration associated with a voltage induced on a resonator of the wireless power receiver. The auxiliary power source can be a voltage source. The period of time can at least partially overlap with a duration in which the value of the auxiliary power source is zero volts. The one or more gate drivers can be configured to drive the one or more respective transistor gates of a tunable matching network of the wireless power receiver. The one or more gate drivers can be configured to drive the one or more respective transistor gates of a protection circuit coupled to a rectifier input or a rectifier output of the wireless power receiver. The value of the auxiliary power source can be a voltage. The signal can indicate whether the value of the auxiliary power source is above or below the predetermined threshold. The one or more gate hold-up circuits can each include at least one pull-up resistor. The one or more gate hold-up circuits can each include at least one capacitor having a capacitance value based on the period of time. The period can be 2 seconds or greater.

In another aspect, the disclosure features a system for protecting one or more components of a wireless power receiver, in which the receiver includes at least one transistor gate. The system can include a gate driver configured provide at least one control signal to control switching of the transistor gate such that power is transmitted to a load coupled to the receiver; and a first controller coupled to the gate driver and configured to generate a protection signal. The protection signal can include (i) a fault signal indicating a fault in one or more components of the receiver; (ii) a signal indicating that the transistor gate should be latched; and/or (ii) at least one undervoltage signal indicating that an undervoltage condition exists in a power supply of the gate driver. Based on the generated protection signal, the gate driver can be configured to adjust the provided control signal to latch the transistor gate such that power is not transmitted to the load.

Various embodiments of the example system can include one or more of the following features. The transistor gate can form a part of an active rectifier. Adjusting the control signal to latch transistor gate can cause a short circuit at an input of the active rectifier. The transistor gate can be of a low-side transistor of the active rectifier. The fault signal can include an under-voltage signal indicating that an output voltage of a power supply of the gate driver is below a predetermined voltage level. The adjusted control signal can be configured to turn on the transistor gate for a period of time. The power supply can include at least one of: a DC-DC converter or an energy storage. The control signal can be a pulse-width modulation (PWM) signal. The system can include a second controller coupled to the gate driver and can be configured to generate the PWM signal. The first controller and second controller can be separate controllers. The load can be a battery. The system can further include a voltage regulator configured to provide a signal indicative of a voltage level of the battery to the second controller. The first controller can be configured to monitor one or more signals associated with at least one of the wireless power receiver, the gate driver, or the power supply to generate the protection signal.

In another aspect, the disclosure features a method for protecting one or more components of a wireless power receiver, in which the receiver includes at least one transistor gate configured to be controlled by at least one gate driver. The method can include providing, by a gate driver, at least one control signal to control switching of the transistor gate such that power is transmitted to a load coupled to the receiver; and generating, by a first controller coupled to the gate driver, a protection signal. The protection signal can include at least one of: (i) a fault signal indicating a fault in one or more components of the receiver; (ii) a signal indicating that the transistor gate should be latched; and/or (ii) at least one undervoltage signal indicating that an undervoltage condition exists in a power supply of the gate driver. The method can include adjusting, by the gate driver based on the received protection signal, the provided control signal to latch the transistor gate such that power is not transmitted to the load.

Various embodiments of the example method can include one or more of the following features. The transistor gate can form a part of an active rectifier. Adjusting the control signal to latch transistor gate can cause a short circuit at an input of the active rectifier. The transistor gate can be of a low-side transistor of the active rectifier. The fault signal can include an under-voltage signal indicating that an output voltage of a power supply of the gate driver is below a predetermined voltage level. The adjusted control signal can be configured to turn on the transistor gate for a period of time. The control signal can be a pulse-width modulation (PWM) signal. The power supply can include at least one of: a DC-DC converter or an energy storage. The control signal can include a pulse-width modulation (PWM) signal. The method can include generating, by a second controller coupled to the gate driver, the PWM signal.

BRIEF DESCRIPTION OF THE DRAWINGS

FIG. 8 is a logic table of the various signals related to the circuits of FIGS. 7A-7D.

DETAILED DESCRIPTION

Disclosed herein are exemplary embodiments of systems and methods for protecting component(s) of a wireless power system. In particular, the exemplary systems and methods can protect component(s) of a wireless power receiver from an over-voltage condition due to a decrease in the auxiliary power used to supply circuitry that controls the component(s).

Wireless Power Systems

Figure 1:
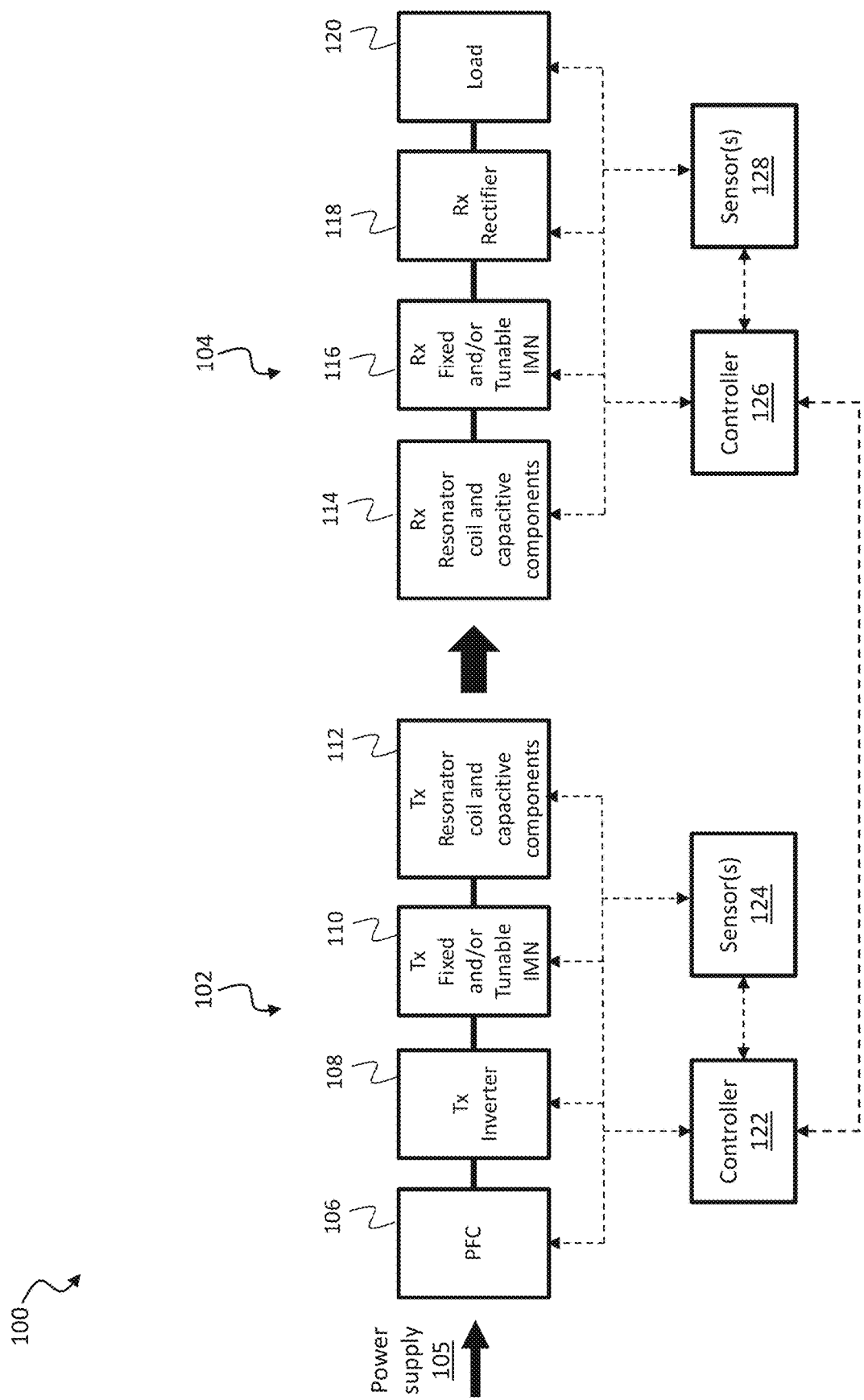
FIG. 1 is a block diagram of an exemplary wireless power system.

FIG. 1 is a block diagram of an exemplary wireless power system 100 including the exemplary system for auxiliary power dropout protection. The system 100 includes a wireless power transmitter 102 and a wireless power receiver 104. In transmitter 104, a power supply 105 (e.g., AC mains, battery, etc.) provides power to an inverter 108. Additional components can include power factor correction (PFC) circuit 106 before the inverter stage 108. The inverter 108 drives the transmitter resonator coil and capacitive components 112 ("resonator"), via an impedance matching network 110 (including fixed and/or tunable network components). The resonator 112 produces an oscillating magnetic field which induces a current and/or voltage in receiver resonator 114. The received energy is provided to a rectifier 118 via impedance matching network 116 (including fixed and/or tunable network components). Ultimately, the rectified power is provided to a load 120 (e.g., one or more batteries of an electric or hybrid vehicle). In some embodiments, the battery voltage level can impact various parameters (e.g., impedance) of the wireless power system 100. Therefore, the battery voltage level may be received, determined, or measured to be provided as input to other portions of the wireless power system 100. For example, typical battery voltage ranges for electric vehicles include 280 V-420 V, etc.

In some embodiments, one or more components of the transmitter 102 can be coupled to a controller 122, which may include a communication module (e.g., Wi-Fi, radio, Bluetooth, in-band signaling mechanism, etc.). In some embodiments, one or more components of the transmitter 102 can be coupled to one or more sensors 124 (e.g., current sensor(s), voltage sensor(s), power sensor(s), temperature sensor(s), fault sensor(s), etc.). The controller 122 and sensor(s) 124 can be operably coupled to control portions of the transmitter 102 based on feedback signals from the sensor(s) 124 and sensor(s) 128.

In some embodiments, one or more components of the receiver 104 can be coupled to a controller 126, which may include a communication module (e.g., Wi-Fi, radio, Bluetooth, in-band signaling mechanism, etc.). In some embodiments, one or more components of the transmitter 102 can be coupled to one or more sensors 128 (e.g., current sensor(s), voltage sensor(s), power sensor(s), temperature sensor(s), fault sensor(s), etc.). The controller 126 and sensor(s) 128 can be operably coupled to control portions of the transmitter 102 based on feedback signals from the sensor(s) 124 and sensor(s) 128.

Examples of wireless power systems can be found in U.S. Patent Application Publication No. 2010/0141042, published Jun. 10, 2010 and titled "Wireless energy transfer systems," and U.S. Patent Application Publication No. 2012/0112535, published May 10, 2012 and titled "Wireless energy transfer for vehicles," both of which are hereby incorporated by reference in their entireties.

In some embodiments, the exemplary impedance matching networks 110, 116 can include one or more variable impedance components. The one or more variable impedance components may be referred together herein as a "tunable matching network" (TMN). TMNs can be used in adjusting the impedance (e.g., including the reactance) of the wireless power transmitter 102 and/or receiver 104. In some embodiments, tunable matching network(s) may be referred to as "tunable reactance circuit(s)". In some applications, e.g., wireless power transmission, impedances seen by the wireless power transmitter 102 and receiver 104 may vary dynamically. In such applications, impedance matching between a receiver resonator coil (of 114) and a load 120, and a transmitter resonator coil (of 112) and the inverter 108, may be required to prevent unnecessary energy losses and excess heat.

The impedance experienced by a resonator coil may be dynamic, in which case, a dynamic impedance matching network can be provided to match the varying impedance to improve the performance (e.g., efficiency, power delivery, etc.) of the system 100. In the case of the power supply 105 in a wireless power system 100, the impedances loading the inverter 108 may be highly variable because of changes in the load 120 receiving power (e.g., battery or battery charging circuitry) and changes in the coupling between the transmitter 102 and receiver 104 (caused, for example, by changes in the relative position of the transmitter and receiver resonator coils). Similarly, the impedance loading the receiver resonator 114 may also change dynamically because of changes in the load 120 receiving power. In addition, the desired impedance matching for the receiver resonator 114 may be different for different coupling conditions and/or power supply conditions.

Accordingly, power transmission systems transmitting and/or receiving power via highly resonant wireless power transfer, for example, may be required to configure or modify impedance matching networks 110, 116 to maintain efficient power transmission. One or more components of the TMN can be configured to present an impedance between a minimum impedance and a maximum impedance attainable by the particular components. In various embodiments, the attainable impedance can be dependent on the operating frequency (e.g., 80 kHz to 90 kHz) of the wireless power system 100. This configuration may be performed continuously, intermittently, or at certain points in power transmission (e.g., at the beginning of power transmission). Examples of tunable matching networks can be found in U.S. Patent Application Publication No. 2017/0217325, published Aug. 3, 2017 and titled "Controlling wireless power transfer systems," and U.S. Patent Application Publication No. 2017/0229917, published Aug. 10, 2017 and titled "PWM capacitor control," both of which are hereby incorporated by reference in their entireties.

High-power wireless power transmitters can be configured to transmit wireless power in applications such as powering of and/or charging a battery of vehicles, industrial machines, robots, or electronic devices relying on high power. For the purpose of illustration, the following disclosure focuses on wireless power transmission for vehicles. However, it is understood that any one or more of the embodiments described herein can be applied to other applications in which wireless power can be utilized.

Auxiliary Power Dropout

In some embodiments, a wireless power receiver 104 can be coupled to a source of auxiliary power 202. FIGS. 2A-2D are schematics of portions 200a, 200b, 200c, 200d respectively of an exemplary wireless power receiver (collectively referred to as receiver 200) coupled to an auxiliary power source 202. For instance, the auxiliary power source 202 can provide power to one or more components of the receiver 104. These components can include the gate driver(s) 204a of the transistor(s) 204b (e.g., field-effect transistor(s) (FETs)) of the tunable matching network (TMN) 206, the gate driver 208a of the transistor 208b (e.g., insulated-gate bipolar transistor (IGBT)) of protection circuit 210 at the output of the rectifier 212, etc. Note that the exemplary systems and methods herein may be configured to operate with various types of transistors including but not limited to: FETs (e.g., junction FETs, metal-oxide semiconductor FETs (MOSFETs)), IGBTs, bipolar junction transistors (BJTs), etc.

In some cases, this auxiliary power source 202 can be beneficial in providing an isolated power source to the gates of transistors 204b, 208b, which can increase noise immunity of low voltage control circuitry. As discussed further below, when the power supplied by the auxiliary power source 202 decreases or drops out (e.g., via a 12 V power rail), the gates of transistors 204b and/or 208b can be turned on and held on to prevent an over-voltage condition as the wireless power transmitter 102 induces a voltage on the receiver resonator 214. For example, the voltage level of a battery configured to supply the auxiliary power may decrease, e.g., without an alternator to charge the battery.

Figure 2A:
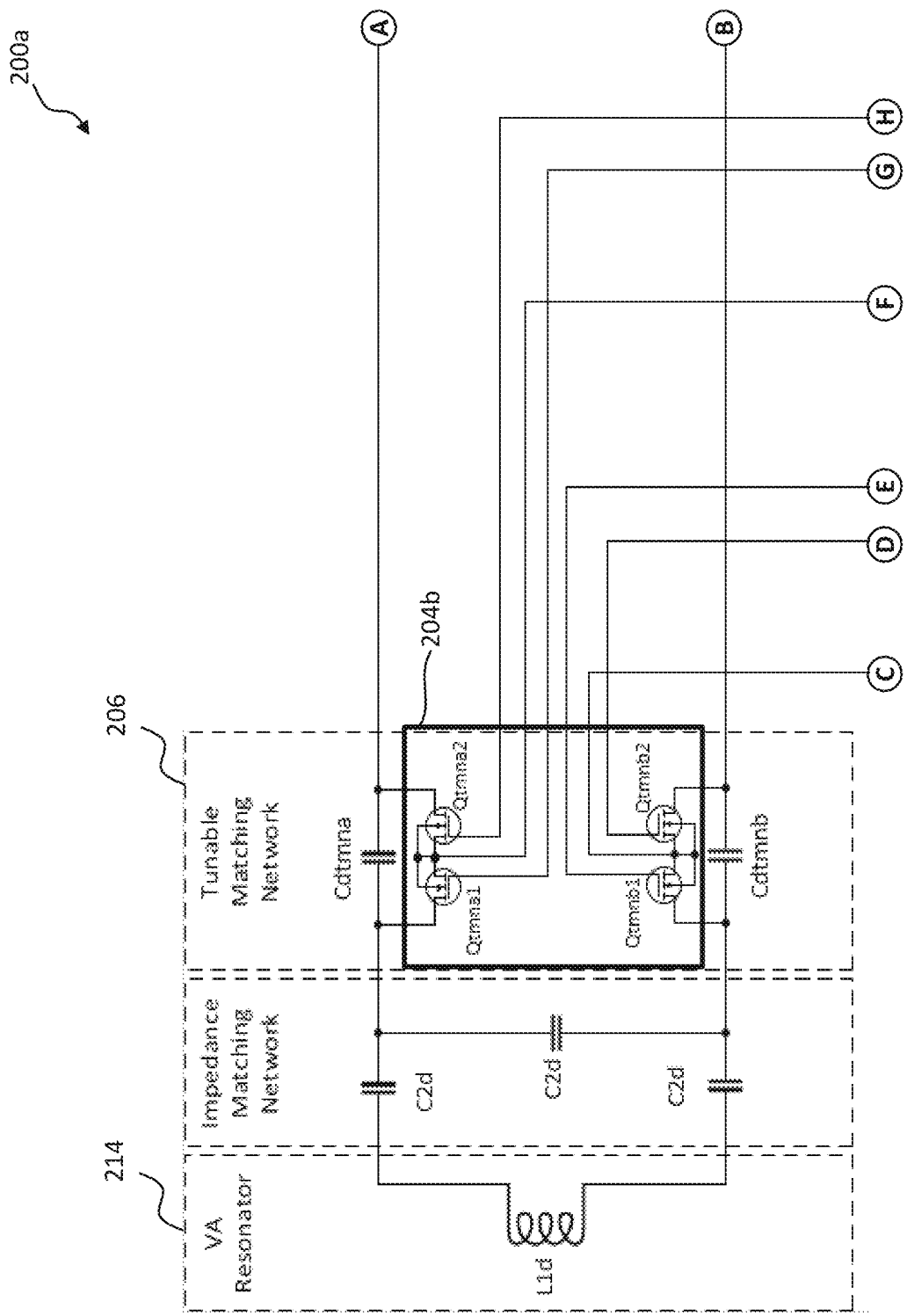
FIGS. 2A-2D are schematics of an exemplary wireless power receiver coupled to an auxiliary power source.
Figure 2B:
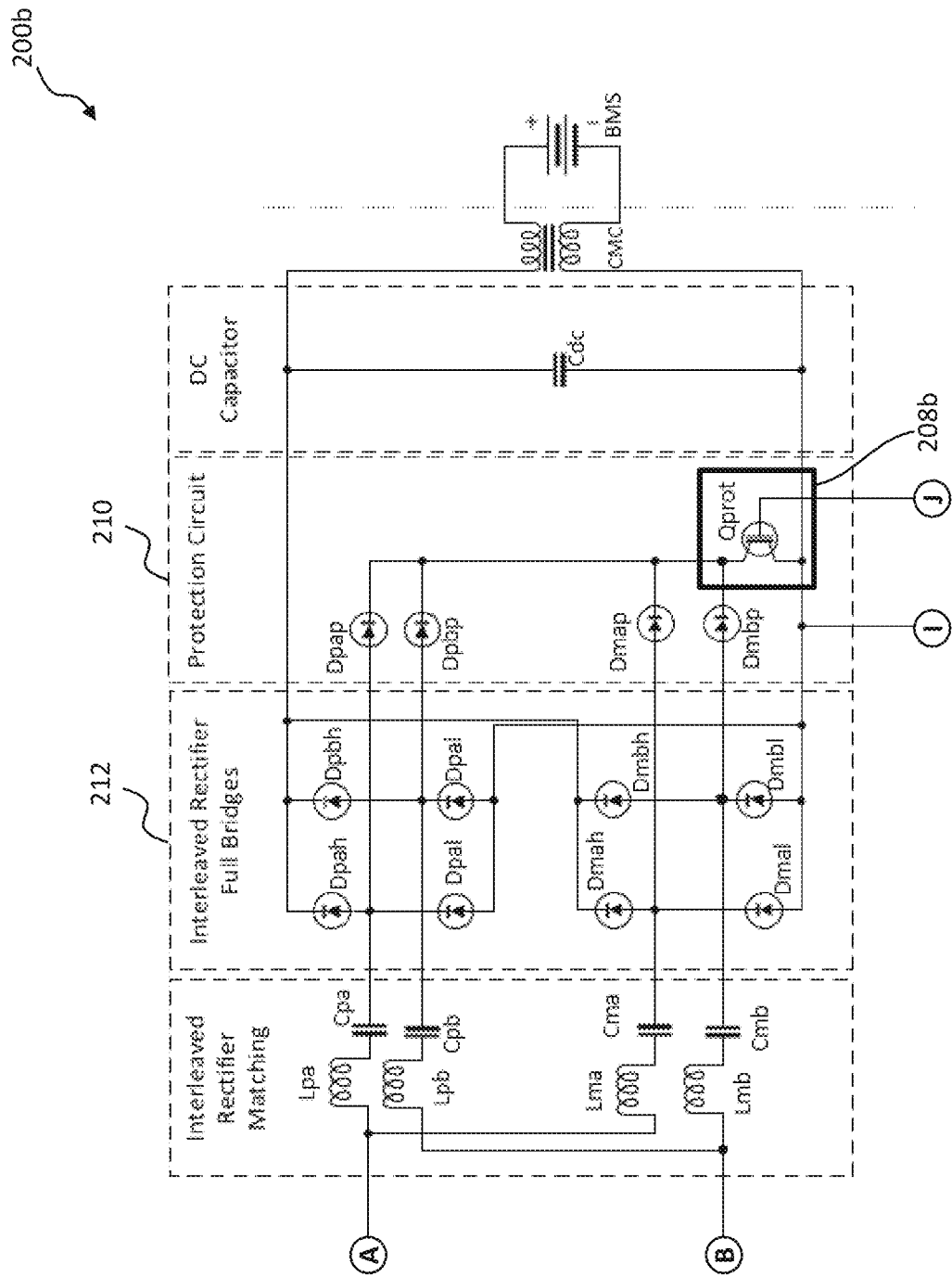
Figure 2C:
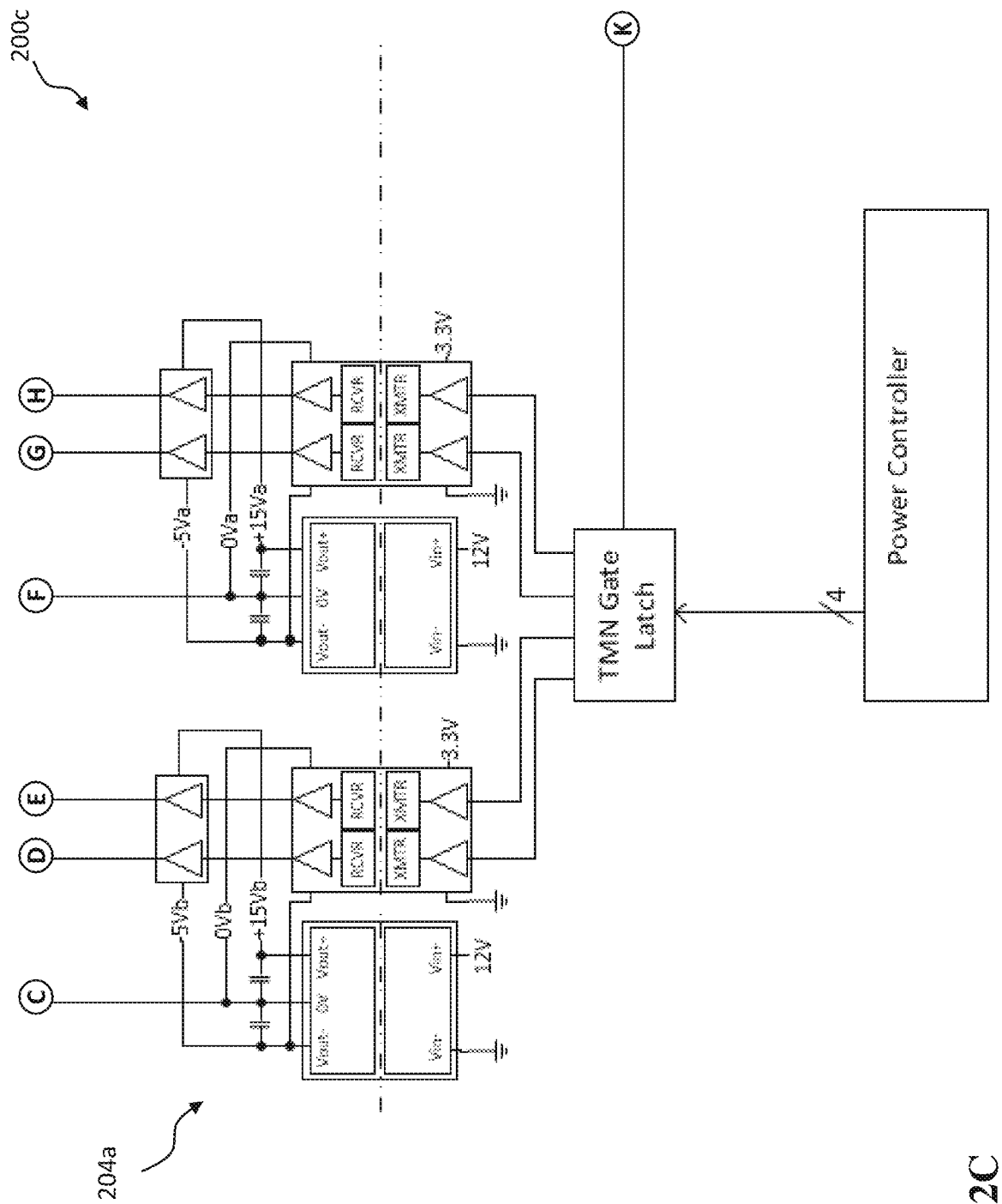
Figure 2D:
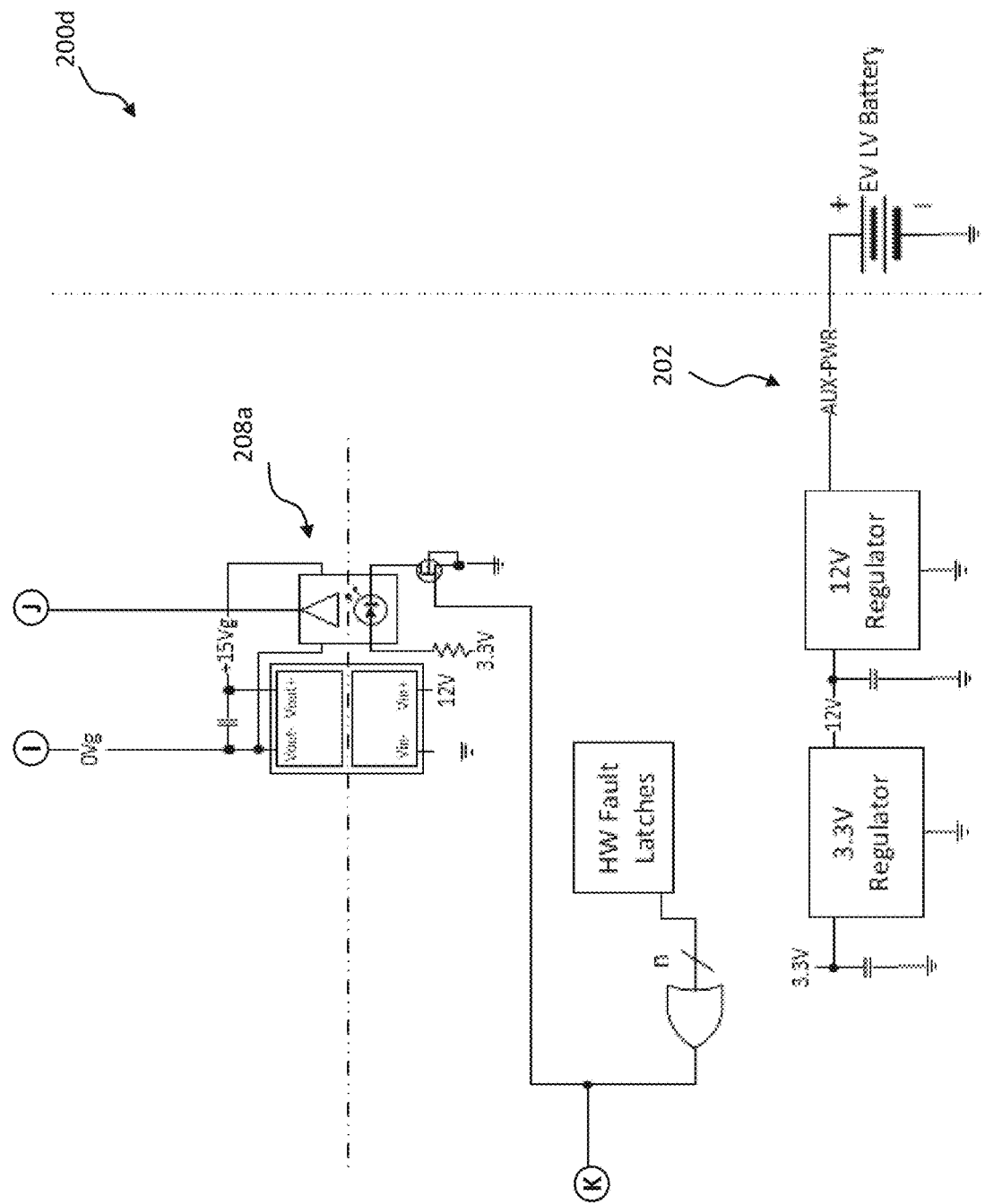
Figure 2E:
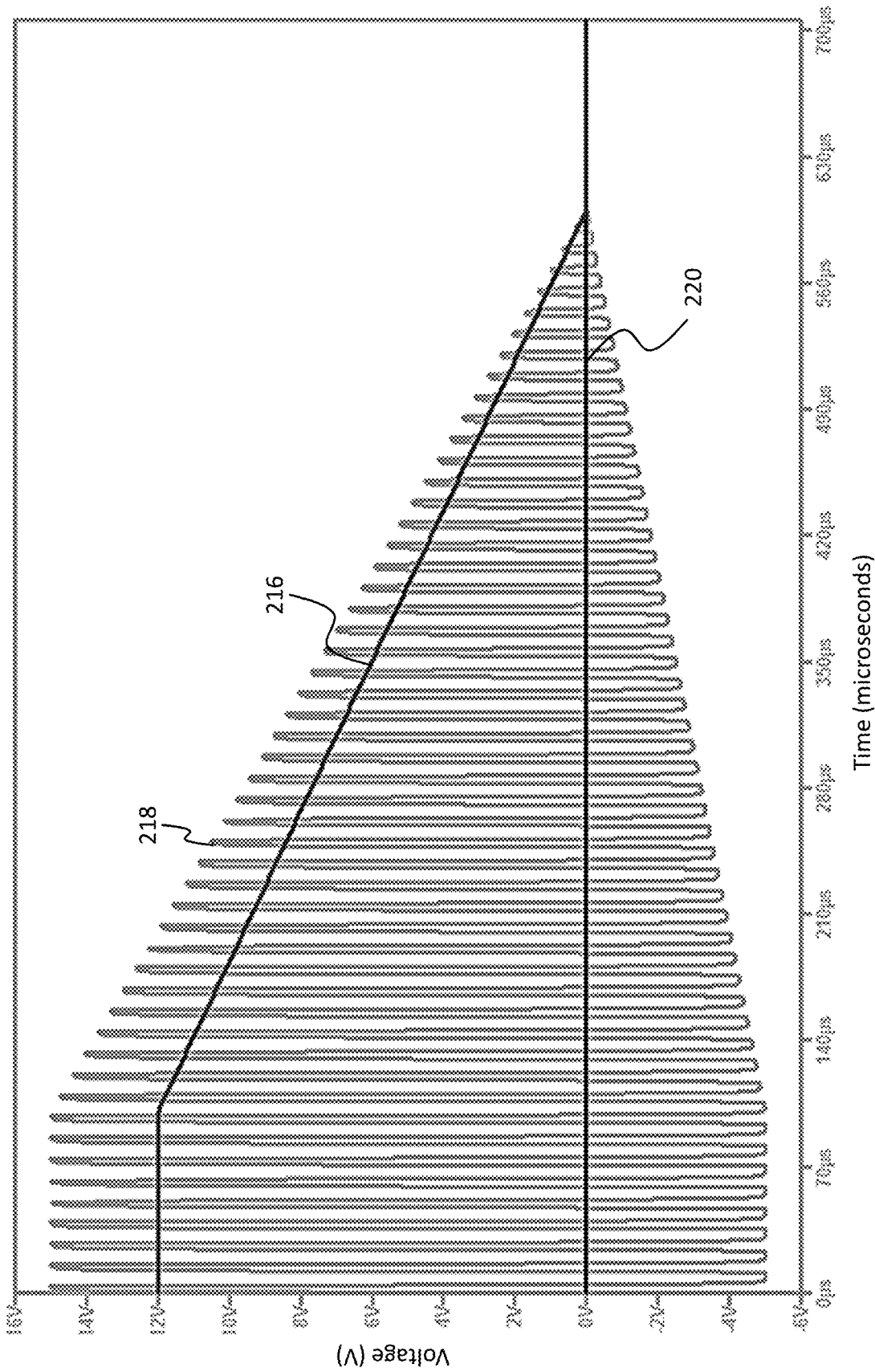
FIG. 2E is a plot illustrating exemplary voltage signals in the wireless power receiver of FIGS. 2A-2D.

For the purposes of comparison, in the example provided in FIGS. 2A-2D, the wireless power receiver 200 does not include an auxiliary power dropout protection circuit to protect the receiver 200 from harm during an auxiliary power dropout. FIG. 2E is a plot illustrating exemplary voltage signals in the wireless power receiver 200. In particular, when the 12 V rail of the auxiliary power source (voltage signal 216) decreases, the voltage determined at a transistor gate also decreases (e.g., gate driver supply output decreases or drops out). For example, the voltage signal 218 representing gate switching associated with transistors 204b decreases over time. The voltage signal 220 representing the gate switching associated with transistor 208b stays at zero due to the absence of the auxiliary power dropout protection circuit (as represented by voltage signal 216). In this example, signals 216, 218, and 220 go to near zero or zero volts within 1 ms. If the wireless power transmitter 102 continues to generate a magnetic field for multiple seconds, and therefore induce a voltage on the receiver resonator (e.g., resonator 214) for multiple seconds, then the transistors 204b and diodes of rectifier 212 become vulnerable to risk of failure and/or harm due to an over-voltage condition because transistors and diodes are turned off.

Protection Systems and Methods

Figure 3A:
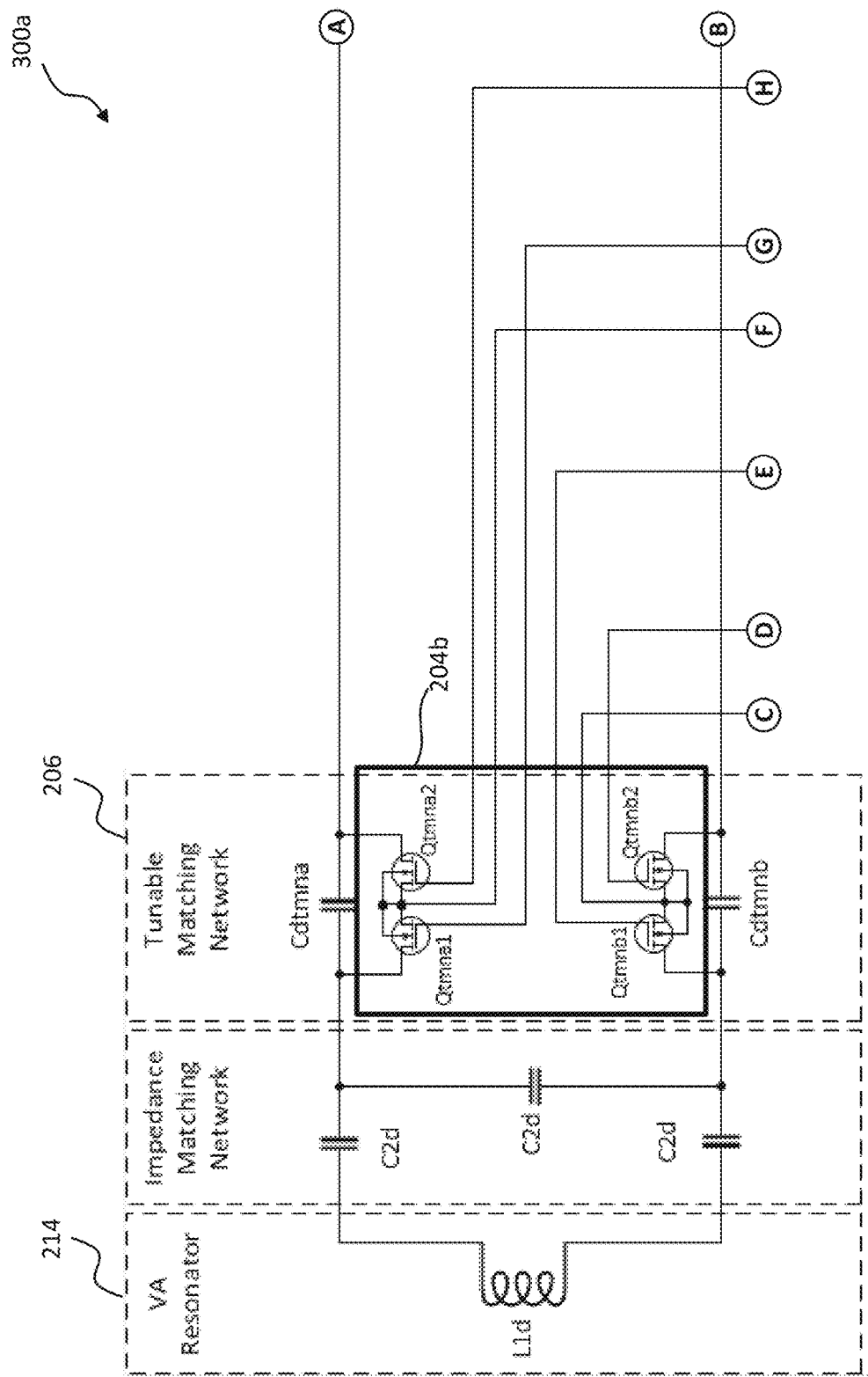
FIGS. 3A-3D are schematics of an exemplary wireless power receiver coupled to an auxiliary power source, which includes an exemplary protection mechanism.
Figure 3B:
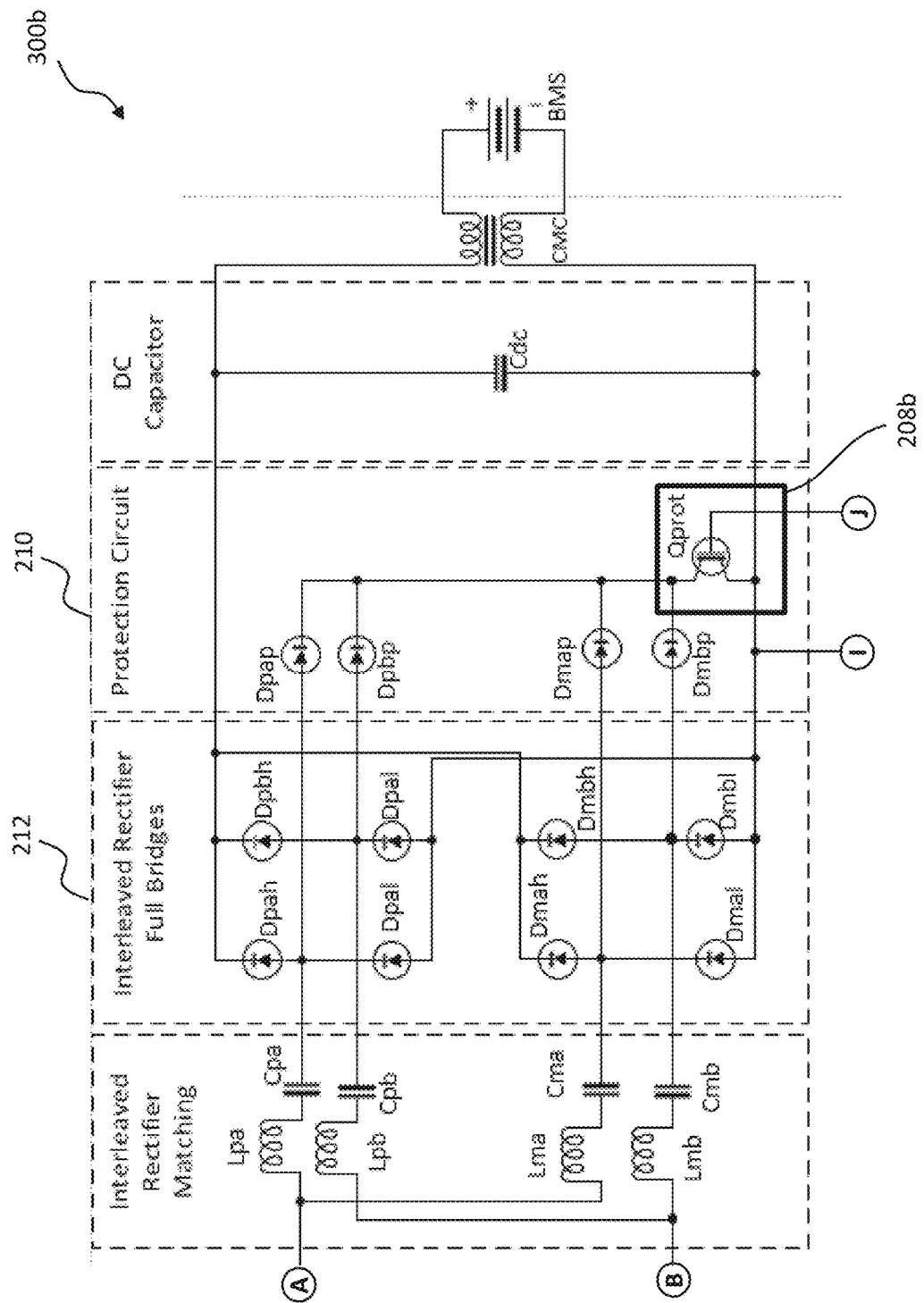
Figure 3C:
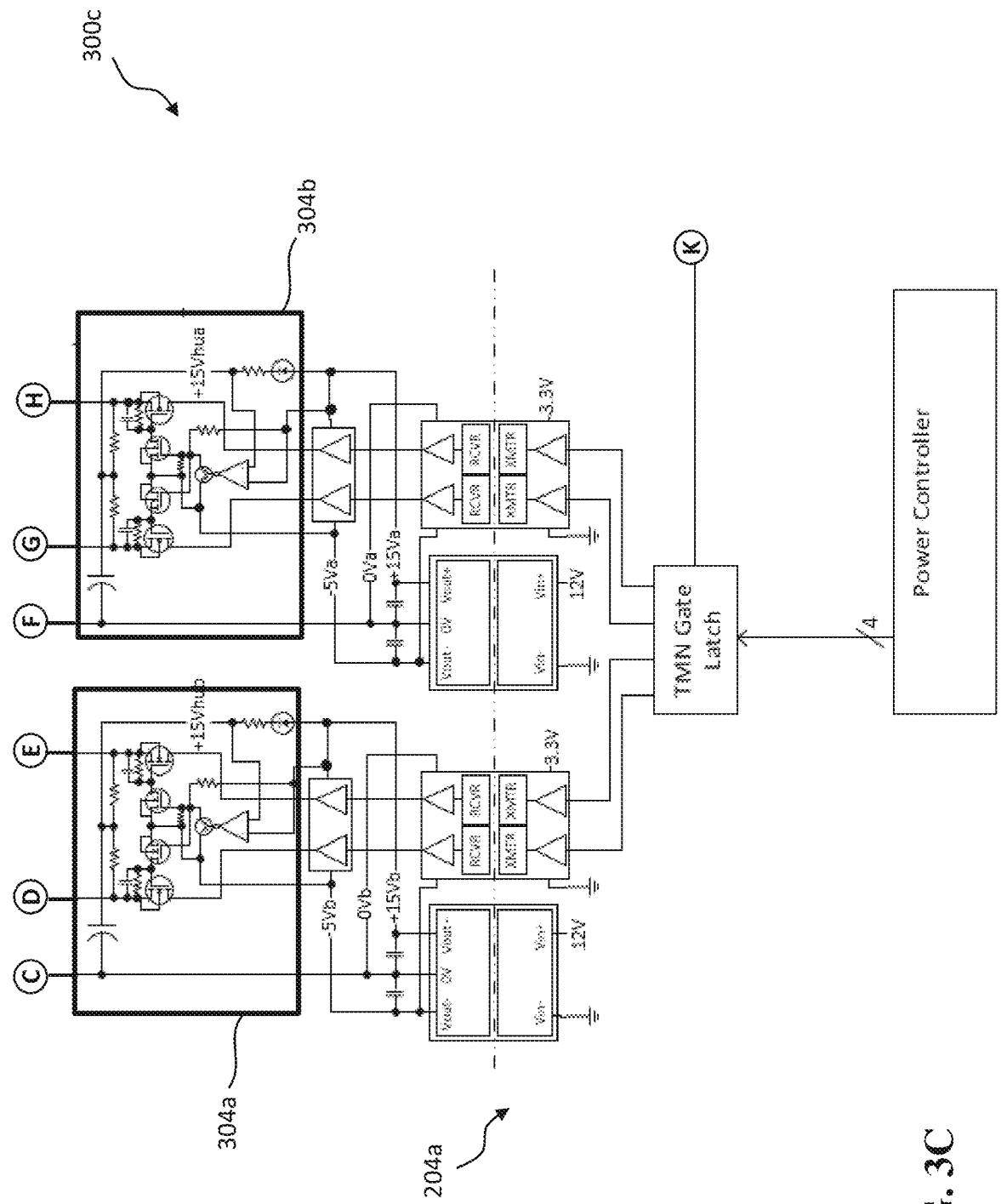
Figure 3D:
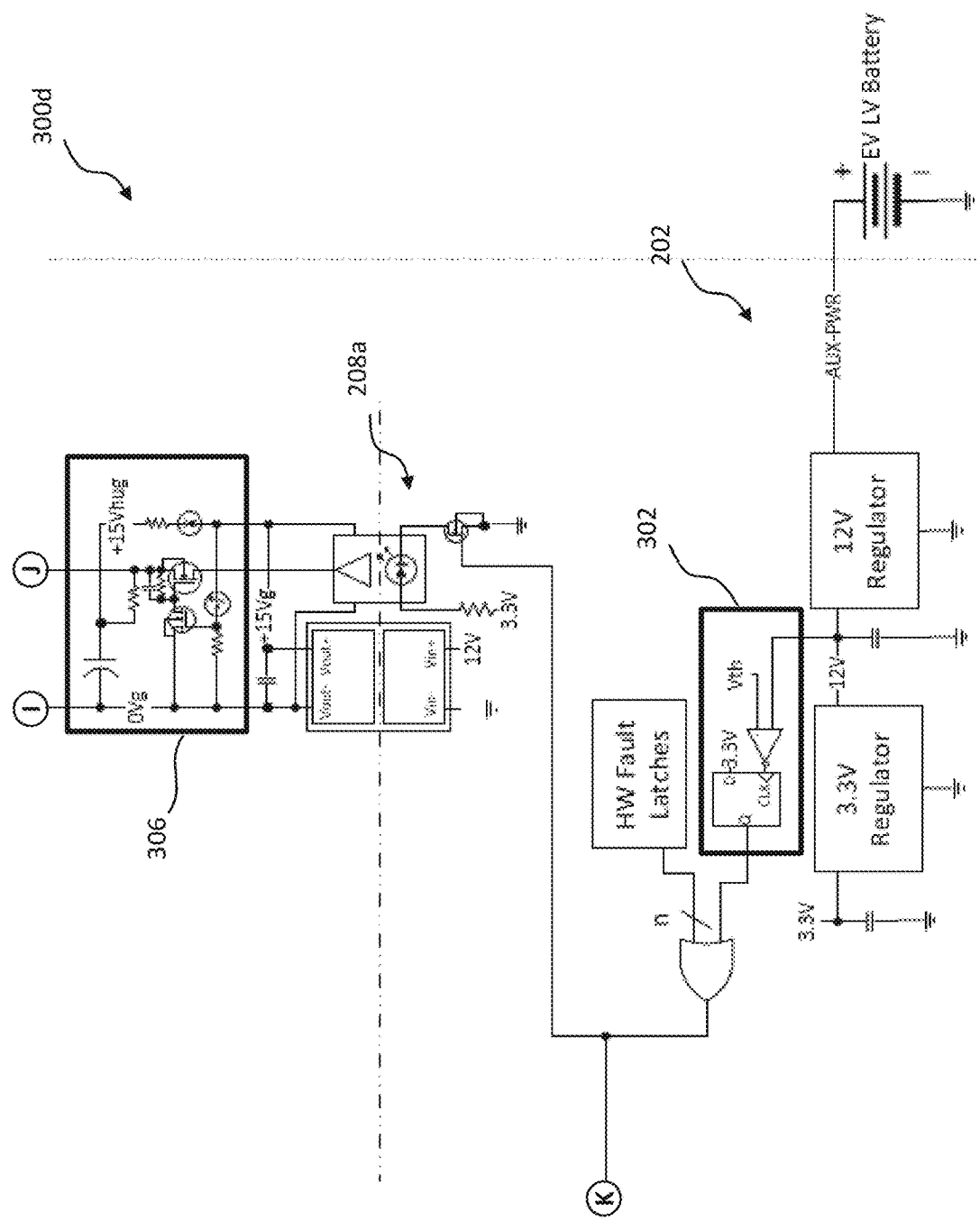
Figure 3E:
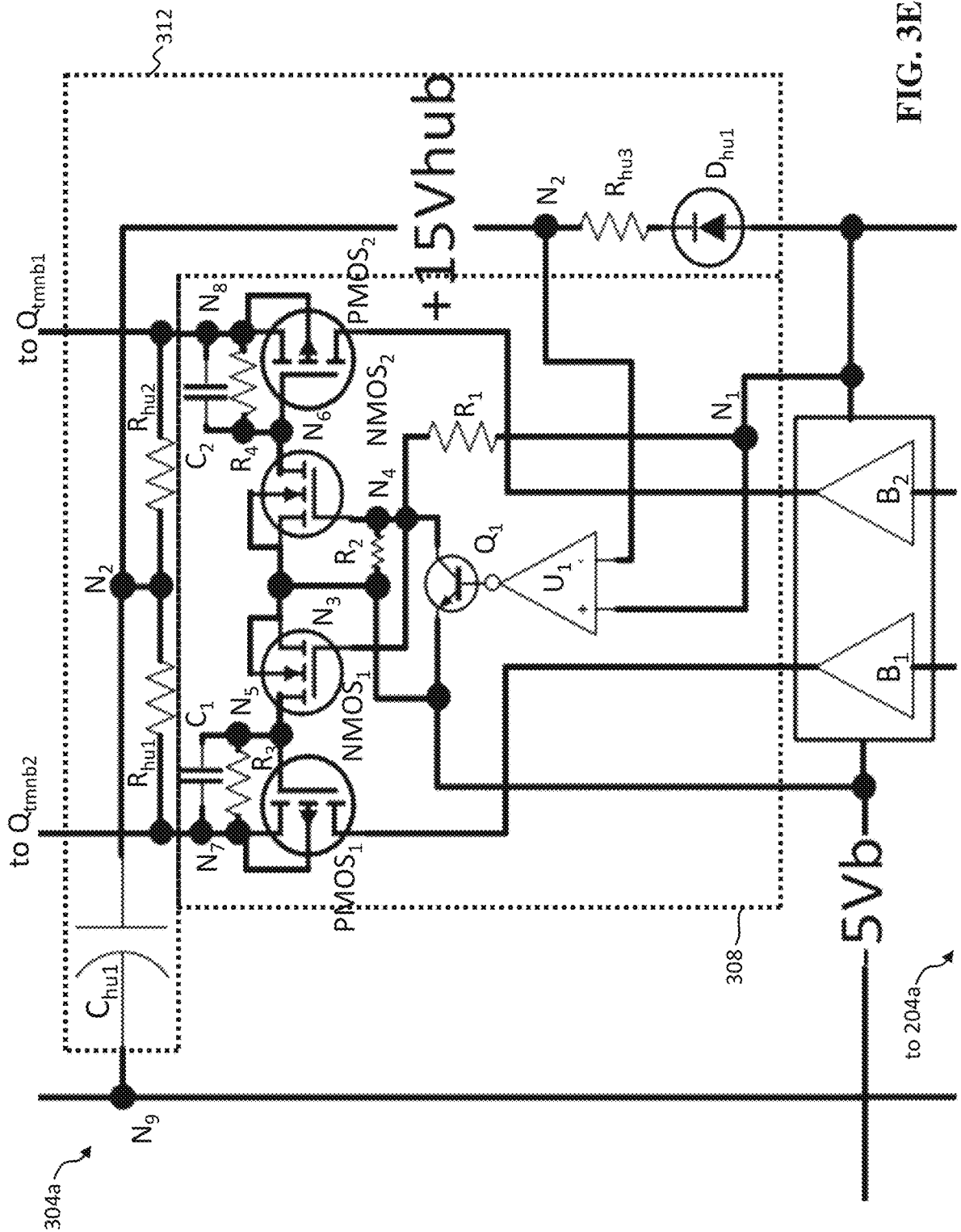
FIG. 3E is a zoomed-in view of the exemplary gate hold-up circuit coupled to one or more transistors of FIG. 3C.
Figure 3F:
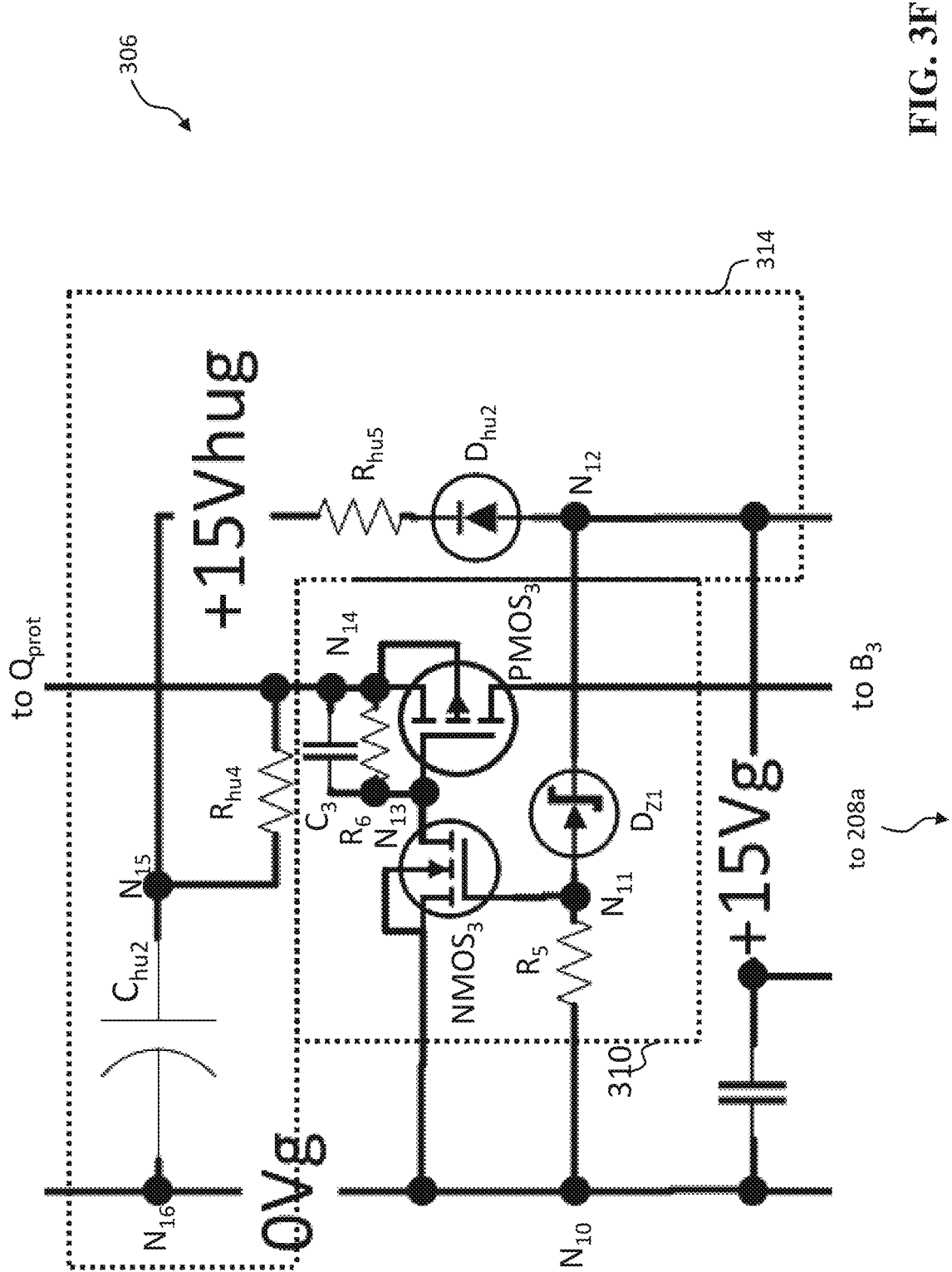
FIG. 3F is a zoomed-in view of the exemplary gate hold-up circuit coupled to transistor of FIG. 3D.

FIGS. 3A-3D are schematics of portions 300a, 300b, 300c, 300d respectively of an exemplary wireless power receiver (collectively referred to as receiver 300) coupled to an auxiliary power source 202, which includes an exemplary protection mechanism. The protection mechanism can include a fault latch 302 and one or more gate hold-up circuits 304a, 304b, 306 to protect the transistors 204b and rectifier diodes 212 from a potential over-voltage condition, as discussed above. Example gate hold-up circuits 304a, 304b are coupled between transistor(s) 204b and gate driver(s) 204a. Example gate hold-up circuit 306 is coupled between transistor 208b and gate driver 208a. FIG. 3E is a zoomed-in view of the exemplary gate hold-up circuit 304a coupled to one or more transistors 204b. In the example provided, gate hold-up circuit 304b is identical or nearly identical to gate hold-up circuit 304a. Therefore, discussion related circuit 304a can be applied to circuit 304b. FIG. 3F is a zoomed-in view of the exemplary gate hold-up circuit 306 coupled to transistor 208b.

Figure 4A:
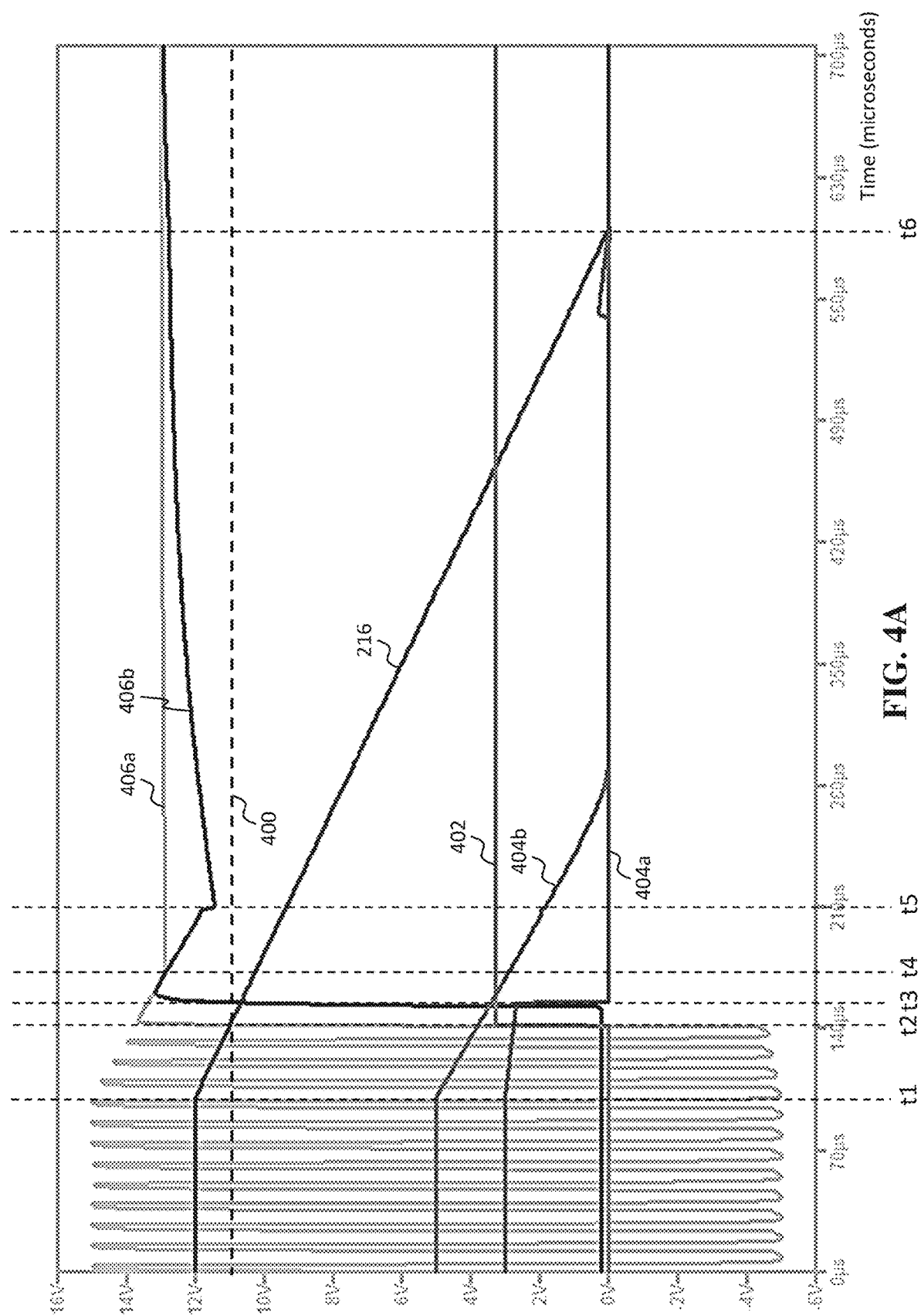
FIG. 4A is a plot illustrating exemplary voltage signals in the wireless power receiver having the exemplary protection mechanism illustrated in FIGS. 3A-3F.
Figure 4B:
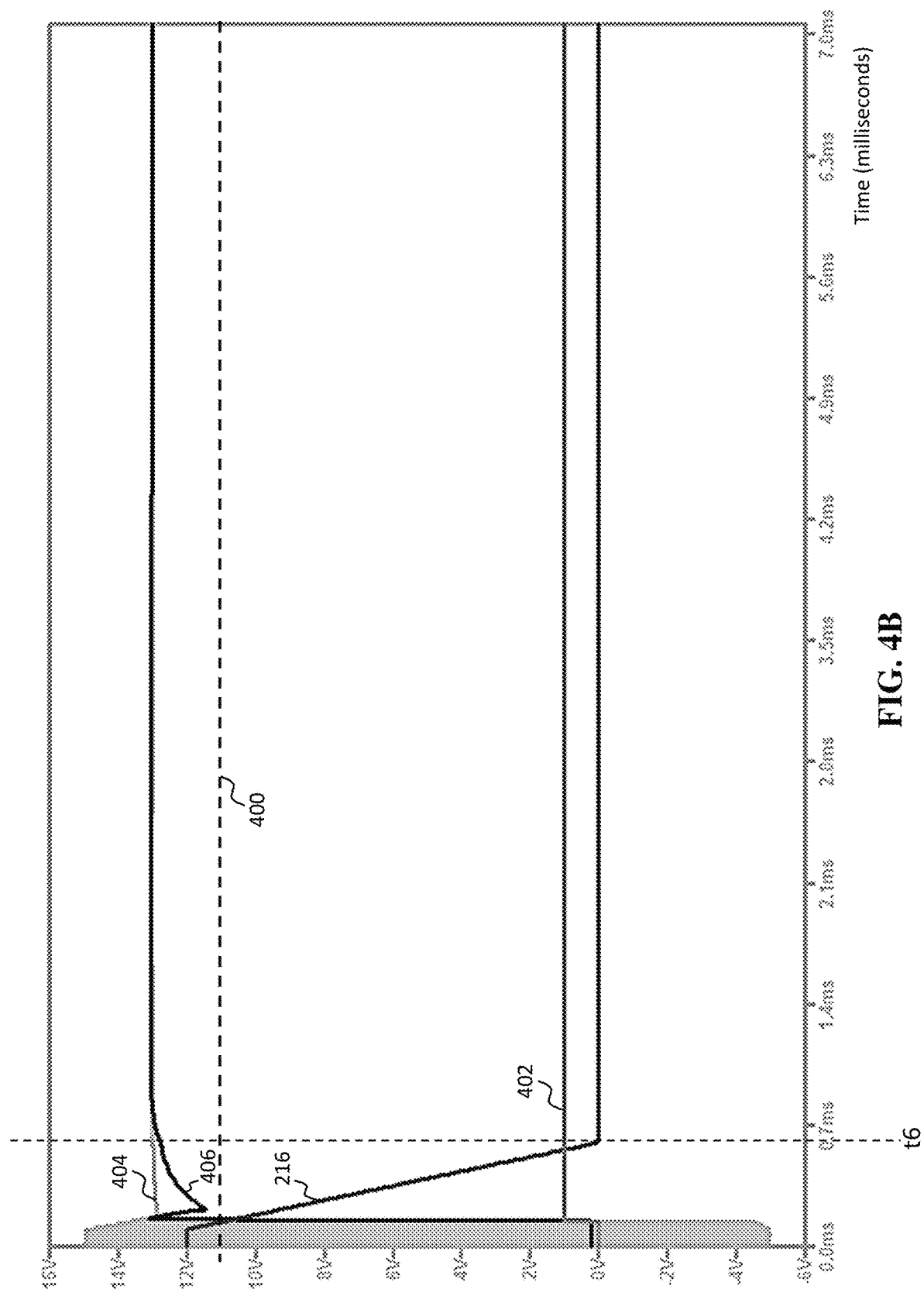
FIG. 4B is a plot illustrating the exemplary voltage signals of FIG. 4A over a longer time period.
Figure 5:
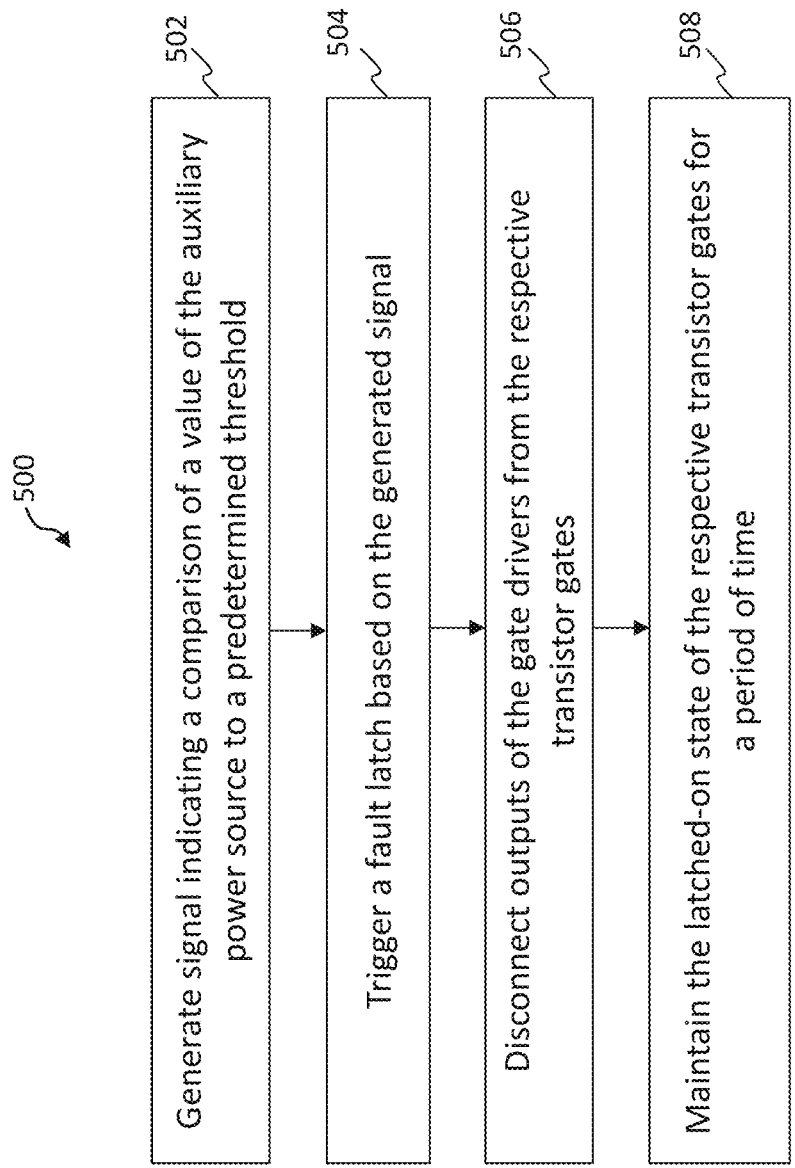
FIG. 5 is a flowchart of an exemplary method for protecting one or more components of the wireless power receiver.

FIG. 4A is a plot illustrating exemplary voltage signals in the wireless power receiver 300 having the exemplary protection mechanism of FIGS. 3A-3F. FIG. 4B is a plot illustrating the exemplary voltage signals of FIG. 4A over a longer time period. FIG. 5 is a flowchart of an exemplary method 500 for protecting one or more components of the wireless power receiver 300. Note that, for the sake of simplicity, various components are referenced below in groups (e.g., transistors 204b, 208b). However, the exemplary methods and systems discussed herein can be utilized and/or applied to a single component or a subset of components of wireless power receiver 104 (e.g., transistor(s) 204b, transistor 208b, transistors $Q_{tmna1}$ of transistor(s) 204b, etc.).

In some embodiments, the auxiliary dropout protection can be activated when the auxiliary power source 202 stops providing power to various components, as described above under heading "Auxiliary Power Dropout". As a consequence, the 12 V rail (signal 216) decreases to zero volts. If, during this time, the transmitter 102 is inducing a voltage on the receiver 104, there is a danger of harm to the component(s) that rely on the auxiliary power.

Referring to FIGS. 3A-5 together, in step 502, a comparator of the fault latch 302 can generate a signal indicating a comparison of a value of an auxiliary power source 202 to a predetermined threshold or range. For example, the value can be an auxiliary power rail voltage. The voltage value can be compared to a predetermined threshold voltage or predetermined voltage range. In some embodiments, the signal can indicate whether the value is above, at, or below the predetermined threshold. In some embodiments, the predetermined threshold is between 3% and 10% below the expected output of the auxiliary power source 202. For example, for an auxiliary power source configured to provide a voltage at approximately 12 V, the predetermined threshold 400 can be 11 V (8.3% below 12 V) or less. In this example, the fault latch can be triggered according to step 504 when the auxiliary power source 202 is providing a voltage under 11 V. In some embodiments, the signal can indicate whether the value is within or outside of the predetermined range. In some embodiments, the predetermined range is ±3% to ±10% outside the expected output range of the auxiliary power source 202. For example, for an auxiliary power source configured to provide a voltage at approximately 12 V, the predetermined range can be 11-13 V (±8.3% relative to 12 V). In this example, the fault latch can be triggered according to step 504 when the auxiliary power source 202 is providing a voltage under 11 V or above 13 V. In FIGS. 4A-4B, signal 216 representing the 12 V rail of the exemplary auxiliary power source 202 decreases at time $t_1$ from approximately 12 V.

In step 504, the fault latch of mechanism 302 can be triggered based on the generated signal (see signal 402 rising at $t_2$). This can result in the turning on of or latching on of the transistor gates (e.g., of transistors 204b or 208b). In some embodiments, upon the trigger of the fault latch, one or more signals can be transmitted to the inputs of the gate drivers 204a, 208a to cause the transistor gates to latch high (latched-on state). In FIGS. 4A-4B, signal 402 representing the fault latch output goes from 0 V to approximately 3.3 V at time $t_2$ signifying that the fault latch has triggered. At approximately time $t_2$, the gate(s) of the TMN transistor(s) 204b latch high. After some propagation delay, at approximately time $t_3$, the gate of the protection circuit transistor 208b latches high.

In step 506, the output(s) of gate driver(s) 204a, 208a can be disconnected via one or more respective switches (also referred to as a switching circuit) 308, 310 from the respective gates of transistors 204b, 208b at $t_4$ and $t_5$ respectively. In some embodiments, the disconnecting of the gate driver outputs can occur within 50 microseconds, within 70 microseconds, within 100 microseconds, etc. after the triggering of fault latch. The exemplary switching circuit 308 can include:

a comparator $U_1$ having inputs coupled to node $N_1$ and node $N_2$ configured to turn on transistor $Q_1$ when the supply voltage $+15V_b$ for gate drivers $B_1$ and $B_2$ drops below hold-up voltage $+15V_{hub}$;

a resistor divider configured to turn on transistors $NMOS_1$ and $NMOS_2$ when transistor $Q_1$ is off, including:
  a resistor $R_1$ coupled between node $N_1$ and node $N_4$;
  a resistor $R_2$ coupled between node $N_3$ and node $N_4$;

an NPN bipolar junction transistor (BJT) $Q_1$ having its emitter coupled to node $N_3$, collector coupled to node $N_4$, and base coupled to the output of comparator $U_1$ configured to turn off transistors $NMOS_1$ and $NMOS_2$ when turned on by comparator $U_1$;

an N-channel MOS transistor $NMOS_1$ having its gate coupled to node $N_4$, drain coupled to node $N_5$, and source coupled to node $N_3$ configured to turn off transistor $PMOS_1$ when turned off by $Q_1$;

an N-channel MOS transistor $NMOS_2$ having its gate coupled to node $N_4$, drain coupled to node $N_6$, and source coupled to node $N_3$ configured to turn off transistor $PMOS_2$ when turned off by transistor $Q_1$;

a capacitor $C_1$ and a resistor $R_3$ coupled in parallel between node $N_5$ and node $N_7$ configured to hold on transistor $PMOS_1$ when transistor $NMOS_1$ is on and to discharge and keep transistor $PMOS_1$ when transistor $NMOS_1$ is off;

a P-channel MOS transistor $PMOS_1$ having its gate coupled to node $N_5$, drain coupled to the output of gate driver $B_1$, and source coupled to node $N_7$ configured to disconnect gate driver $B_1$ from transistor $Q_{tmnb2}$ when turned off by transistor $NMOS_1$;

a capacitor $C_2$ and a resistor $R_4$ coupled in parallel between node $N_6$ and node $N_8$ configured to hold on transistor $PMOS_2$ when transistor $NMOS_2$ is on and to keep transistor $PMOS_2$ off when transistor $NMOS_2$ is off; and a P-channel MOS transistor $PMOS_2$ having its gate coupled to node $N_6$, drain coupled to the output of gate driver $B_2$, and source coupled to node $N_8$ configured to disconnect gate driver $B_2$ from transistor $Q_{tmnb1}$ when turned off by transistor $NMOS_2$.

In this exemplary embodiment, one objective is to disconnect the output of the gate drivers $B_1$ and $B_2$ from transistors $Q_{tmnb2}$ and $Q_{tmnb1}$. Accordingly, P-channel MOSFETs (e.g., $PMOS_1$ and $PMOS_2$) were selected to be connected in series with high-side paths because they turn on by pulling their gate voltages below their source voltages. By using N-channel MOSFETs (e.g., $NMOS_1$ and $NMOS_2$, respectively) to connect the P-channel MOSFET gates to $-5$ Vb, the P-channel MOSFETs can be turned on if the P-channel MOSFET sources are +15 V when the outputs of the drivers $B_1$ and $B_2$ are high. The P-channel MOSFETs can remain on for a short period of time after the driver outputs go low to $-5$ Vb because the source-to-gate voltages are held on by capacitors $C_1$ and $C_2$, respectively. By turning off the N-channel MOSFETs, the P-channel MOSFET gates are disconnected from $-5$ Vb and the respective voltages across the source-to-gate capacitors $C_1$ and $C_2$ decay to zero (0) V by discharging through resistors $R_3$ and $R_4$, respectively. The N-channel MOSFETs can be turned off when the comparator $U_1$ detects that the gate supply voltage +15 Vb has dropped below +15 Vhub.

The exemplary switching circuit 310 can include:

a resistor $R_5$ coupled between node $N_{10}$ and $N_{11}$ and configured to allow current through diode $D_{Z1}$ so that it blocks its specified voltage;

a Zener diode $D_{Z1}$ coupled between node $N_{11}$ and node $N_{12}$, when combined with resistor $R_5$, and configured to keep transistor $NMOS_3$ turned on when +15 Vg is greater than the Zener voltage of diode $D_{Z1}$ plus the gate voltage threshold of transistor $NMOS_3$;

an N-channel MOS transistor $NMOS_3$ having its gate coupled to node $N_{11}$, drain coupled to node $N_{13}$, and source coupled to node $N_{10}$ and configured to turn off transistor $PMOS_3$ when +15 Vg drops below Zener voltage of diode $D_{Z1}$ plus the gate voltage threshold of transistor $NMOS_3$;

a P-channel MOS transistor $PMOS_3$ having its gate coupled to node $N_{13}$, drain coupled to the output of gate driver $B_3$, and source coupled to node $N_{14}$ and configured to disconnect gate driver $B_3$ from transistor $Q_{prot}$ when turned off by transistor $NMOS_3$; and a capacitor $C_3$ and a resistor $R_6$ coupled in parallel between node $N_{13}$ and node $N_{14}$ and configured to hold on transistor $PMOS_3$ when transistor $NMOS_3$ is on and to keep transistor $PMOS_3$ off when transistor $NMOS_2$ is off.

In this exemplary embodiment, one objective is to disconnect the output of the $B_3$ from $Q_{prot}$. Accordingly, a P-channel MOSFET (e.g., $PMOS_3$) was selected to be connected in series with high-side paths because it turns on by pulling its gate voltage below its source voltage. By using an N-channel MOSFET (e.g., $NMOS_3$) to connect the P-channel MOSFET gates to 0 Vg, the P-channel MOSFET can be turned on if the P-channel MOSFET source is +15 V when the output of the driver $B_3$ is high. The P-channel MOSFET can remain on for a short period of time after the driver output goes low to 0 Vg because the source-to-gate voltage is held on by capacitor $C_3$. By turning off the N-channel MOSFET, the P-channel MOSFET gate is disconnected from 0 Vg and the voltage across the source-to-gate capacitors $C_3$ decays to zero (0) V by discharging through resistors $R_6$. The N-channel MOSFET can be turned off when the +15 Vg drops below the sum of Zener voltage of diode DZ1 and $NMOS_3$ gate threshold voltage.

Referring to FIGS. 4A-4B, signal 404a, the output of comparator $U_1$ and gate source voltage of $NMOS_1$ and $NMOS_2$, at time $t_3$, drops to zero (0) V initiating the disconnecting of the output(s) of the gate driver 204a from the gate of TMN transistor(s) 204b at time $t_4$. At time $t_5$, signal 404b, the gate voltage of $NMOS_3$, drops below the gate threshold voltage of $NMOS_3$ and initiates the disconnecting of the output(s) of the gate driver 208a from the gate of protection circuit transistor(s) 208b. Note that the voltage at the switches starts to decrease at or near time $t_1$.

In step 508, the latched-on state of the respective gates of transistors 204b, 208b can be held or maintained via respective gate hold-up circuits 312, 314 coupled to the gates of transistors 204b, 208b. The exemplary gate hold-up circuit 312 can include:

a resistor Rho coupled between node $N_7$ and node $N_2$ and configured to pull the gate of transistor $Q_{tmnb2}$ to +15 Vhub when transistor $PMOS_1$ is disconnecting transistor $Q_{tmnb2}$ from gate driver $B_1$;

a resistor $R_{hu2}$ coupled between node $N_2$ and node $N_8$ and configured to pull the gate of transistor $Q_{tmnb1}$ to +15 Vhub when transistor $PMOS_2$ is disconnecting transistor $Q_{tmnb1}$ from gate driver $B_2$;

a capacitor $C_{hu1}$ coupled between node $N_9$ and node $N_2$ and configured to store enough charge and maintain high voltage on node $N_2$, +15 Vhub, and the gates of transistors $Q_{tmnb2}$ and $Q_{tmnb1}$ after +15 Vb has dropped out; and a diode $D_{hu1}$ in series with resistor $R_{hu3}$ coupled between node $N_2$ and node $N_1$ and configured to charge capacitor $C_{hu1}$ while +15 Vg still has voltage and to prevent capacitor $C_{hu1}$ from discharging after +15 Vb has dropped out.

In this exemplary embodiment, one objective is to create a voltage source to keep the gates of transistors $Q_{tmnb2}$ and $Q_{tmnb1}$ held up after +15 Vb has dropped out. The bulk capacitor $C_{hu1}$ can be charged through a diode $D_{hu1}$ in series with resistor $R_{hu3}$ when +15 Vb still has voltage and then supplies voltage to the gates of transistors $Q_{tmnb2}$ and $Q_{tmnb1}$ after +15 Vb has dropped out through $R_{hu1}$ and $R_{hu2}$, respectively.

The exemplary gate hold-up circuit 314 can include:

a resistor $R_{hu4}$ coupled between node $N_{14}$ and node $N_{15}$ and configured to pull the gate of transistor $Q_{prot}$ to +15 Vhug when transistor PMOS$_3$ is disconnecting transistor $Q_{prot}$ from gate driver $B_3$;

a capacitor $C_{hu2}$ coupled between node $N_{15}$ and node $N_{16}$ and configured to store enough charge and maintain high voltage on node $N_{15}$, +15 Vhug, and the gate of transistor $Q_{prot}$ after +15 Vg has dropped out; and a diode $D_{hu2}$ in series with resistor $R_{hu5}$ coupled between node $N_{15}$ and node $N_{12}$ and configured to charge capacitor $C_{hu2}$ while +15 Vg still has voltage and to prevent capacitor $C_{hu2}$ from discharging after +15 Vg has dropped out.

In this exemplary embodiment, one objective is to create a voltage source to keep the gates of transistor $Q_{prot}$ held up after +15 Vb has dropped out. The bulk capacitor $C_{hu2}$ can be charged through a diode $D_{hu2}$ in series with resistor $R_{hu5}$ when +15 Vb still has voltage and then supplies voltage to the gates of transistor $Q_{prot}$ after +15 Vg has dropped out through $R_{hu4}$.

Referring to FIGS. 4A-4B, signal 406a, the gate voltage of TMN transistors 204b, at and after time $t_4$, represents the maintenance of the latched-on state of the gates of TMN transistors 204b. Signal 406b, the gate voltage of protection circuit transistor 208b, at and after time $t_5$, represents the maintenance of latched-on state of the gate of the protection circuit transistor 208b.

In some embodiments, one or more of the hold-up circuits 312, 314 are configured to keep the respective gates of transistors 204b, 208b held up for a period of time after the auxiliary power has dropped to or near 0 V. In some embodiments, the gate(s) can be held up for 1 second or less, 2 seconds or less, 3 seconds or less, or greater after the auxiliary power has dropped to or near 0 V. For example, in FIG. 4B, the gates are held up as long as the auxiliary power is at or near 0 V.

In some embodiments, the hold-up circuit(s) 312, 314 include pull-up resistor(s) to maintain the latched-on state of the transistor gates. For example, hold-up circuit 312 includes pull-up resistor(s) $R_{hu1}$ and $R_{hu2}$ (e.g., 10 kΩ resistor(s)) and hold-up circuit 314 includes pull-up resistor $R_{hu5}$ (e.g., 100 kΩ resistor(s)), coupled to the respective hold-up capacitors. In some embodiments, the respective capacitance values of the capacitors $C_{hu1}$ and $C_{hu2}$ can be selected such that the hold-up circuit(s) 312, 314 are able to maintain the latched-on state of the transistor gates for the expected time that the transmitter 102 is inducing a voltage on the resonator of receiver 104. Typically, the greater the capacitance value, the longer the latched-on state of the gates can be maintained. An example hold-up capacitance value for each of capacitors $C_{hu1}$ and $C_{hu2}$ is 1 mF. In some embodiments, it can be beneficial for the respective discharge currents of the capacitors $C_{hu1}$ and $C_{hu2}$ to be low in the effort to maintain the latched-on state. The discharge current comes from the gate leakage current, $I_{GSS}$, of transistors 204b and 208b and the drain leakage currents, $I_{DSS}$, of the MOSFETs in the switching circuits 308 and 310.

An example calculation of the hold-up capacitor $C_{hu2}$ discharge rate is:

$$\frac{dV_{C_{hu2}}}{dt} = \frac{I_{GSS_{Qprot}} + I_{DSS_{PMOS_3}} + I_{GSS_{NMOS_3}}}{C_{hu2}} = \frac{I_{discharge}}{C_{hu2}}$$

It is beneficial for the hold-up capacitor voltage to remain above the transistor 204b and 208b gate threshold voltage for as long as the transmitter 102 is inducing a voltage on the resonator of receiver 104. An example target hold-up duration is 2 seconds, an example gate threshold voltage of transistor 208b, $Q_{prot}$, is 7.5 V and an example discharge current on the hold-up capacitor $C_{hu2}$ is 2.4 uA. An example calculation of a minimum hold-up capacitor for these requirements is:

$$C_{hu2} > I_{discharge} \frac{dt}{dV_{C_{hu2}}} = \frac{2.4 \text{ uA} * 2 \text{ s}}{15 \text{ V} - 7.5 \text{ V}} = 640 \text{ nF}$$

In some embodiments, the gates are released (e.g., no longer held up by the hold-up circuits 312, 314) if the value of the auxiliary power source returns to an expected value (or within a range of values).

Gate Driver Operation

In exemplary wireless power receivers, active rectification can be used to generate the desired DC signal for powering a load or charging a battery 120. Active rectification employs actively controlled switches coupled so as to form a rectifier (e.g., in a half-bridge configuration or a full-bridge configuration). Switches can include transistors (e.g., FETs, MOSFETs, BJTs, IGBTs, etc.). In an exemplary wireless power system, an active rectifier can be used to convert oscillating current (AC) received at the wireless power receiver to direct current (DC), which can be used to ultimately transfer energy to a load, as described further below.

Figure 6:
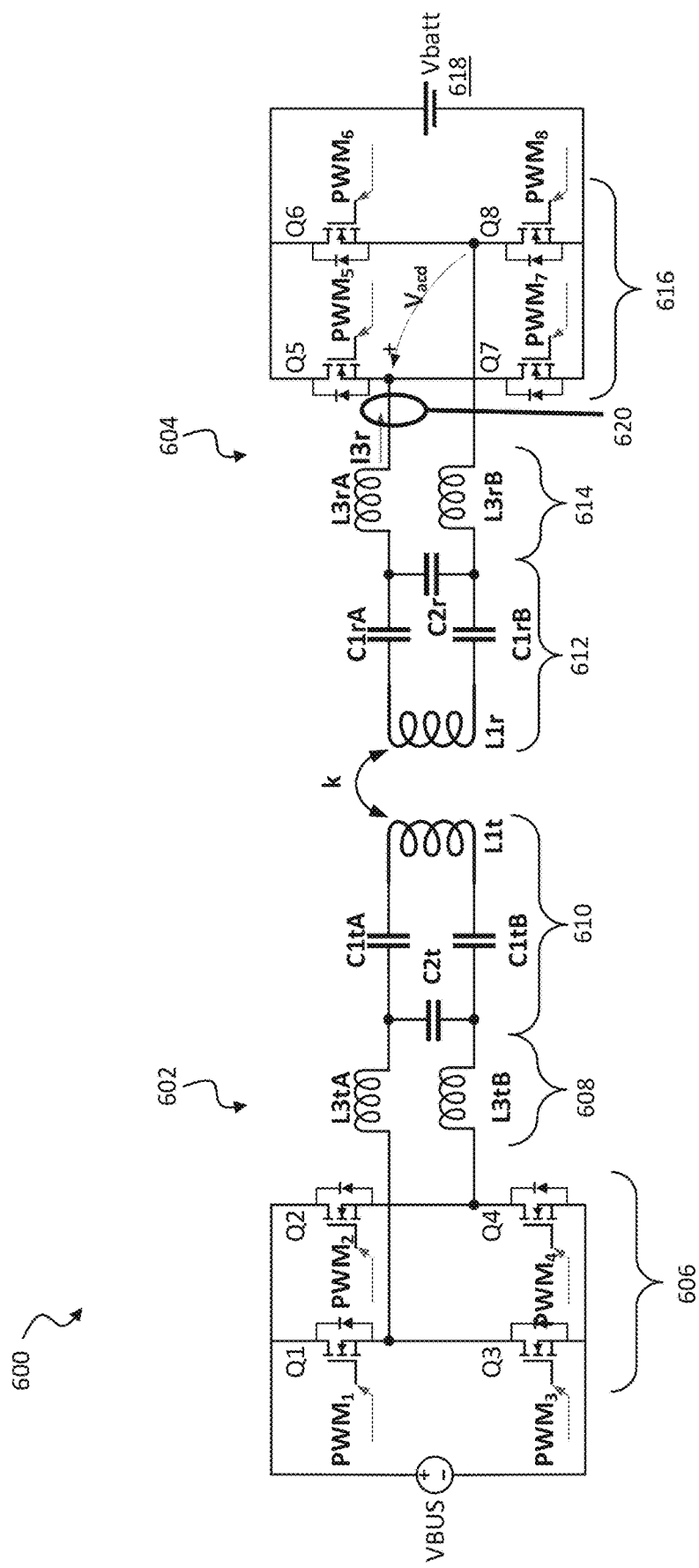
FIG. 6 is a schematic of an exemplary wireless power system utilizing active rectification.

FIG. 6 is a schematic of an exemplary wireless power system 600 utilizing active rectification. The exemplary system 600 includes a wireless power transmitter 602 and receiver 604. The exemplary transmitter 602 includes an inverter 606 (e.g., a half-bridge inverter, a full-bridge inverter, etc.) coupled to a filter circuit 608 (which can include, e.g., one or more inductive components L3tA, L3tB, one or more capacitive components, etc.). The inverter 606 can include two or more switches (e.g., transistors Q1, Q2, Q3, and Q4). The switches Q1, Q2, Q3, Q4 can be controlled via respective control signals PWM1, PWM2, PWM3, PWM4. The filter 608 can be further coupled to a transmitting resonator and/or matching circuit 610 (including capacitors C2t, C1tA, C1tB, and resonator coil L1t), as described above.

In this exemplary system 600, the resonator coil L1t of circuit 208 can be inductively coupled to the resonator coil L1r of receiving resonator and/or matching circuit 612 (including capacitors C1rA, C1rB, C2r, and inductor L1r) so as to wirelessly transmit power from the transmitter 602 to the receiver 604. Note that the transmitter coil L1t generates an oscillating magnetic field, which can induce an oscillating current at the receiver coil L1r. This current can have a frequency of, for example, 85 kHz. In many instances, the current I3r can include harmonics due to the inverter 606. In some embodiments, characteristics (e.g., phase, amplitude, shape, harmonic content, etc.) of the current I3r can be further influenced (e.g., shaped, distorted, etc.) by one or more components of the receiver 604. For example, circuits 612 and 614 can include inductive and/or capacitive components that can alter the phase or shape of the current I3r. In some cases, the distortions of the current I3r can create challenges in operating the rectifier switches, as described further below.

The exemplary receiver 604 can include filter circuit 614 (including, e.g., one or more inductive components L3rA, L3rB, one or more capacitive components, etc.) coupled to the receiving resonator and/or matching circuit 612. The filter circuit 614 can change characteristics (e.g., reduce distortions) of the current I3r.

The filter circuit 614 can be coupled to the rectifier 616 (e.g., a half-bridge rectifier, a full-bridge rectifier, etc.), which can include two or more switches (e.g., transistors Q5, Q6, Q7, and Q8). The exemplary rectifier 616 can be coupled directly or indirectly to a load 618 (e.g., a battery). In some embodiments, a current sensor 620 can determine (e.g., measure, sense, etc.) the characteristics of the current I3r. The current sensor 620 can be coupled at the output of the filter 614 and/or input of the rectifier 616. For example, the current sensor 620 may determine the phase of the current I3r at the input of the rectifier 616. The sensor signal may be provided to a processor and/or controller (e.g., controller 126) for processing. In some embodiments, the processor and/or controller may generate control signals (e.g., PWM signals) for controlling one or more switches of the rectifier 616 based on the current sensor 620 signal(s). Each switch (e.g., transistor) of the rectifier 616 may be controlled by a corresponding gate driver. The processor and/or controller can provide the control signals (e.g., PWM5, PWM6, PWM7, PWM8) to gate drivers of one or more switches (e.g., transistors Q5, Q6, Q7, Q8, respectively) of the rectifier 616. In some embodiments, the current sensor 620 can include a zero-crossing detector configured to detect zero-crossings by the current I3r. The detector signal may be provided to the controller (e.g., controller 126) to determining the control signals of the switches.

In some embodiments, the control signals can cause the rectifier switches to operate in various modes. The modes can include hard switching and soft switching (e.g., zero voltage switching). In some embodiments, the rectifier switches can operate in one mode during a first time period and operate in another mode during a second time period. In some cases, the switches may alternate between two modes during a given time period.

In some embodiments, the transistor(s) of the active rectifier 616 can operate as a safety mechanism to protect one or more components of the wireless power system 600. For example, one or more of the following failure modes may be dangerous and/or have harmful effects: overcharging battery 618; vehicle departing during power transmission; over-voltage condition in one or more components of the receiver 604; a short-circuit in one or more components of the receiver 604; and/or circulating energy in the receiver 604.

In some cases, to protect against one or more of the above-described failure scenarios, it can be beneficial for the transistors of the receiver 604 to be turned on by gate drivers. These transistors can include (i) transistors of the rectifier (e.g., turning on transistors Q7 and Q8 while transistors Q5 and Q6 are turned off); (ii) gate drivers 204a of transistors 204b of the TMN 206; and/or (iii) the gate drivers 208a of transistors 208b of protection circuit 210 at the output of the rectifier 212. Failure of a gate driver may lead to one or more of the above failure scenarios. A gate driver may fail and/or may fail to turn on a transistor in any one or more in the following scenarios (also referred to as "failure modes"):

An under-voltage condition of a battery coupled to the gate driver. For example, an under-voltage condition may be that the voltage of a 12 V battery is less than 6 V.

An over-voltage condition of a battery coupled the gate driver. For example, an over-voltage condition may be that the voltage of a 12 V battery is greater than 18 V.

A power supply of the gate driver has a failure, under-voltage, over-voltage, or short-circuit event.

Improper generation of PWMs (e.g., PWM signal is low (e.g., zero or ground)).

Controller coupled to the gate driver(s) fails.

The gate driver(s) for the transistor(s) of an active rectifier 616 may be configured to protect against one or more of the above-described failure modes. In various embodiments, the gate driver(s) may be configured to latch on or turn on the gates of the rectifier transistors (e.g., turning on transistors Q7 and Q8 while transistors Q5 and Q6 are turned off) to effectively short the rectifier. By shorting the rectifier, the wireless power receiver and/or the coupled vehicle can be protected from various fault states as described.

Figure 7A:
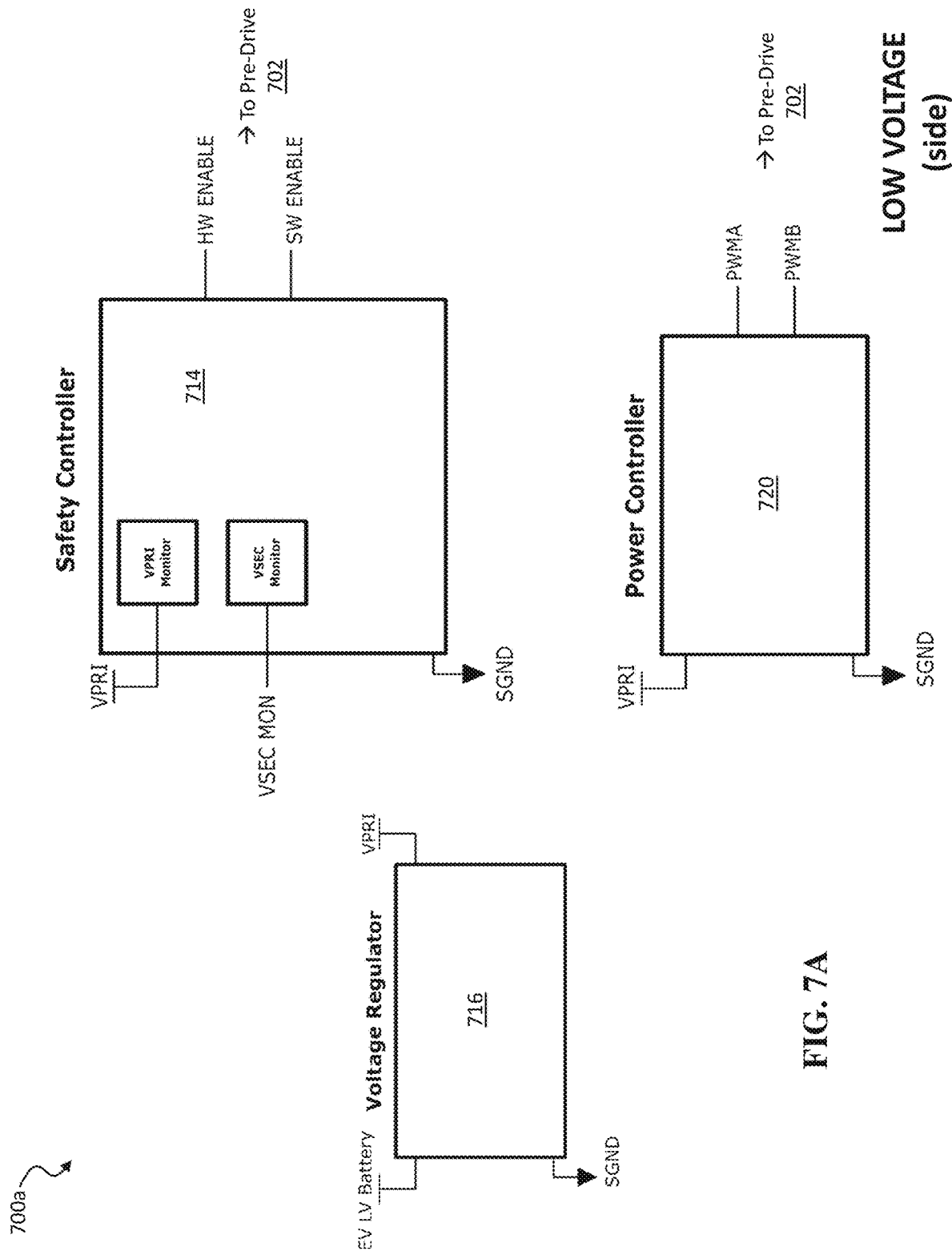
FIG. 7A is a block diagram representing one or more components configured to provide signals to the gate driver system of FIGS. 7B-7C.
Figure 7B:
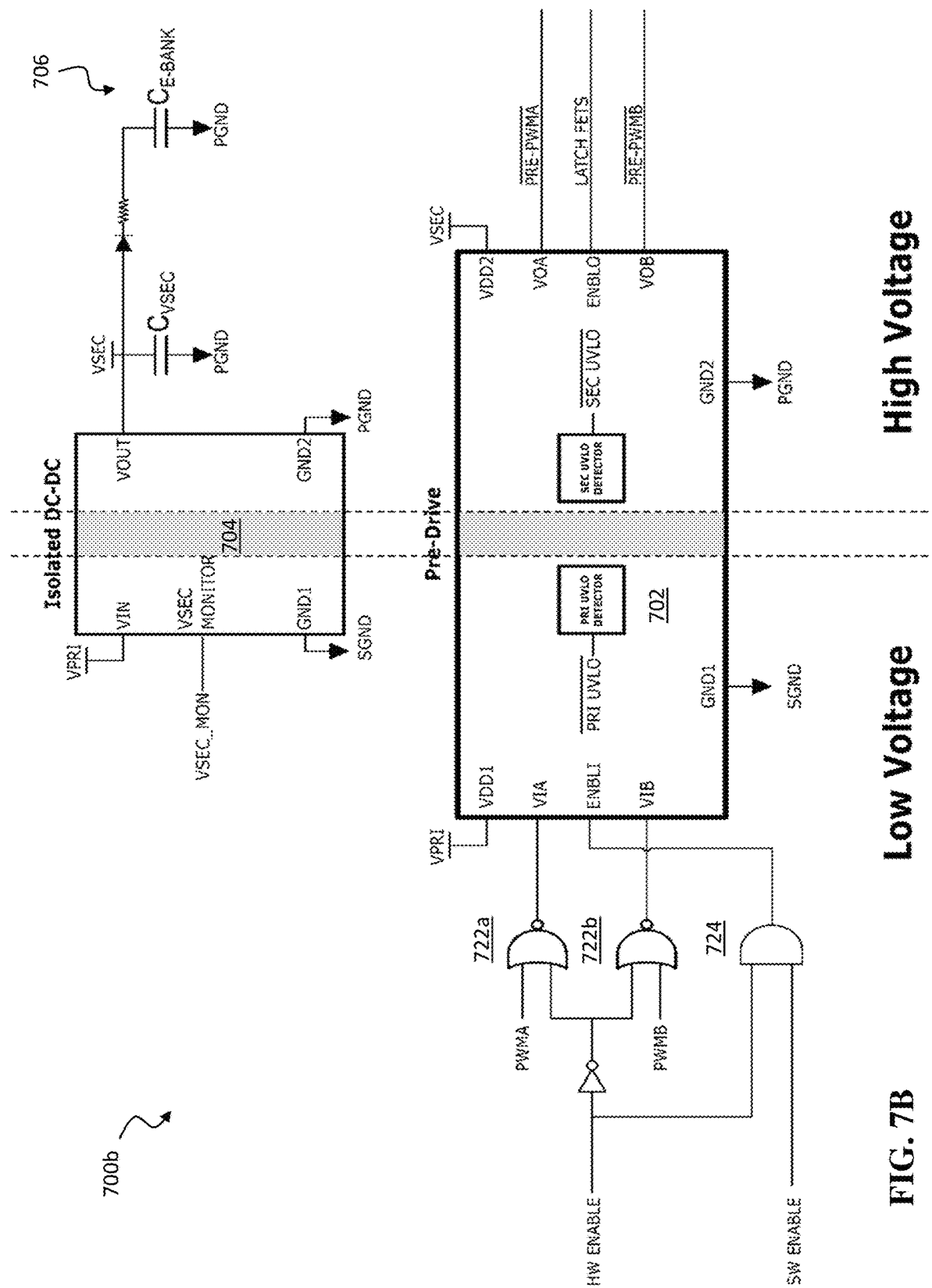
FIGS. 7B-7C are block diagrams representing an exemplary gate driver system for protecting a wireless power receiver of FIG. 7D against a failure mode.
Figure 7C:
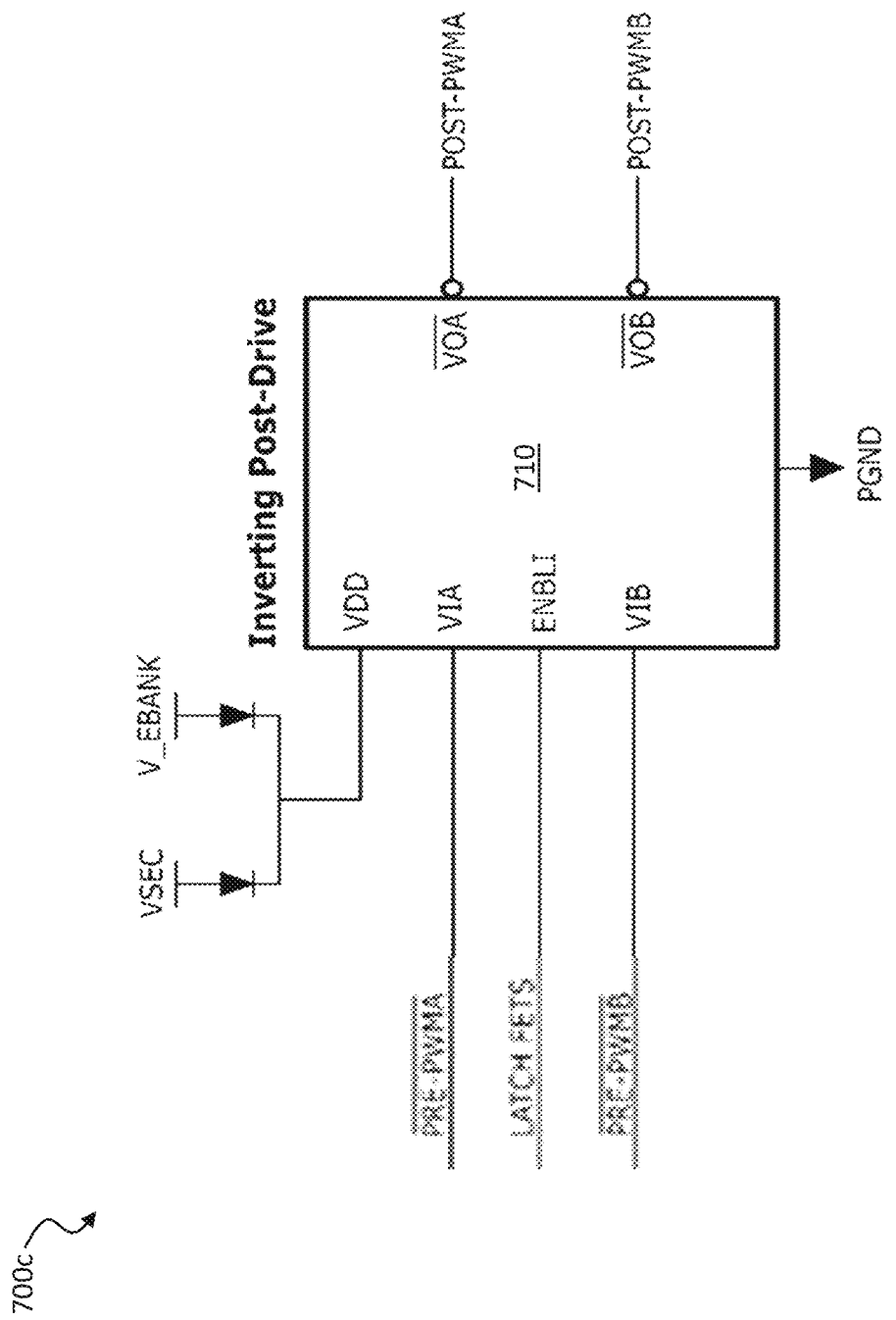
Figure 7D:
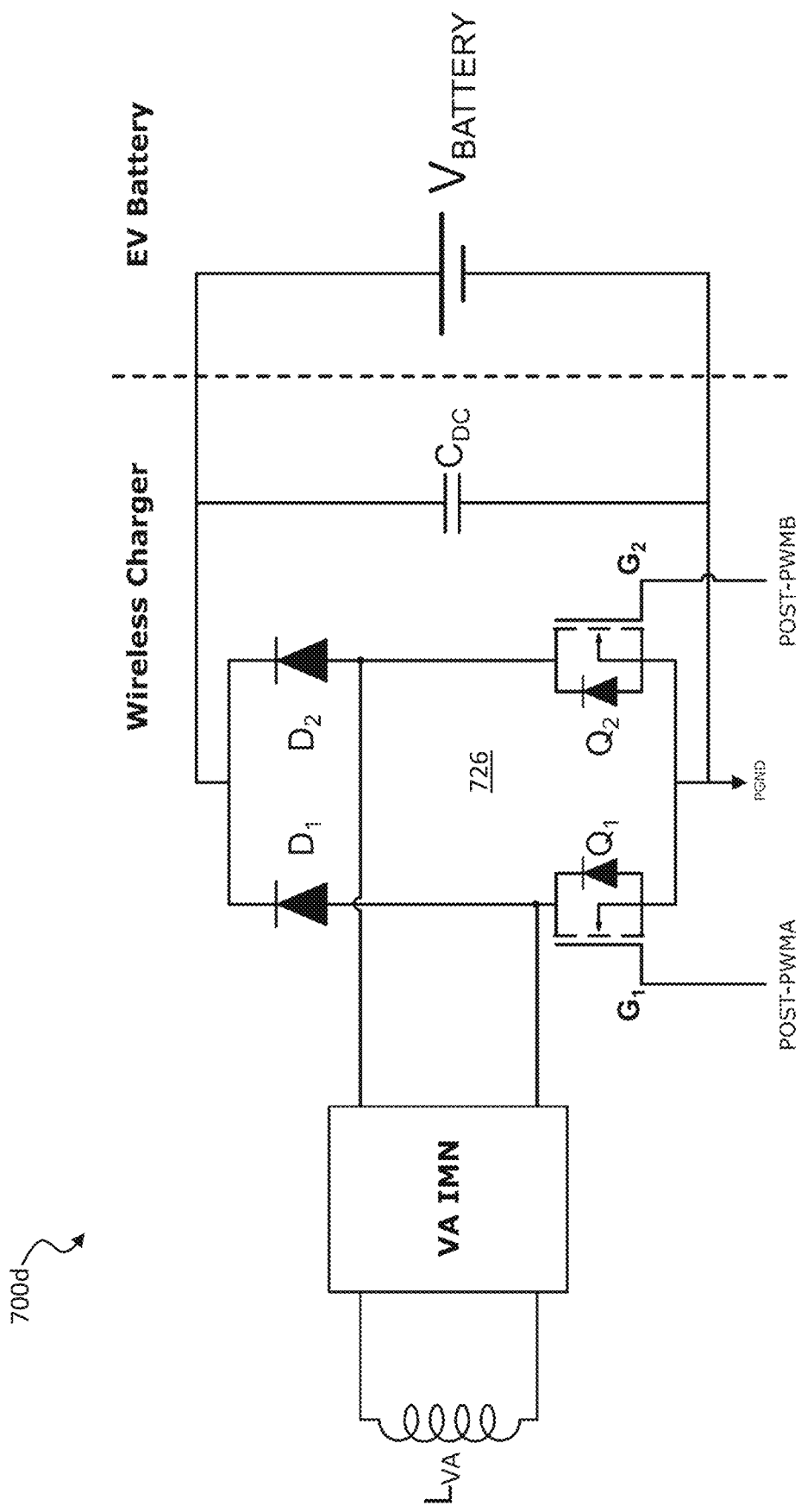
FIG. 7D is a schematic representing the connection between the exemplary gate driver system of FIGS. 7B-7C and an exemplary active rectifier of a wireless power receiver.

FIG. 7A illustrates a block diagram representing one or more components 700a configured to provide signals to the gate driver system 700b, 700c of FIGS. 7B-7C. FIGS. 7B-7C illustrate a block diagram representing an exemplary gate driver system 700b, 700c for protecting a wireless power receiver 700d against a failure mode. The exemplary gate driver system 700b, 700c may include a pre-drive stage 702, a power supply 704, energy storage 706, and a post-drive stage 710. FIG. 7D illustrates the connection between the exemplary gate driver system 700b, 700c and an exemplary active rectifier 726 for a wireless power receiver 700d (e.g., having low-side transistors Q1, Q2).

Referring to FIG. 7A, the gate driver system 700b, 700c may receive one or more signals from a safety controller 714 to enable the protection mode. The controller 714 may be configured to:

monitor the output voltage level(s) (e.g., primary output voltage level VPRI and/or secondary output voltage level VSEC) of the power supply 704 (e.g., an isolated DC-to-DC converter);

monitor the voltage level of the 12 V battery coupled to the power supply; and/or generate a signal (e.g., "HW ENABLE") according to a fault condition for the gate driver system 700b, 700c. HW ENABLE is a hardware control signal that enables the normal operation of the hardware of the gate driver system 700b, 700c during power transmission mode. The controller 714 may generate a hardware signal HW ENABLE based at least in part on the monitored voltage levels VPRI, VSEC from the power supply 704 for providing to the pre-drive stage 702. In some cases, the signal HW ENABLE may have a binary output. The signal HW ENABLE can be "high" (also referred to as "asserted") when there is no fault condition. When there is no fault condition, the PWM signals enable switching during power transmission mode. When a fault condition occurs, the HW ENABLE is "low" (also referred to as "disabled"). The hardware signal HW ENABLE may be de-asserted in response to a power stage over-current or over-voltage event detected by the safety controller 714. The HW ENABLE signal may be set low if the voltage of the 12 V battery is too low (when compared to a lower threshold, e.g., 6 V, 8 V, 10 V, etc.) or too high (when compared to a higher threshold, e.g., 14 V, 16, 18 V, etc.).

The safety controller 714 may be configured to de-assert an enable signal (SW ENABLE) to enable the protection mode of the gate driver system 700b, 700c. Signal SW ENABLE is a software control signal that enables the normal operation of the software or firmware of the gate driver system 700b, 700c during power transmission mode. Signal SW ENABLE are based at least in part on the monitored voltage levels VPRI, VSEC. Signal SW ENABLE is high (asserted) when the system is power transmission mode and low (de-asserted) when in protection mode. The enable signal SW ENABLE may be produced (is high or asserted) when the safety controller has cleared all fault latches in the system (e.g., gate driver system 700b and 700c, wireless power receiver, wireless power system, etc.), when one or more diagnostic self-test routines have been performed, and/or when the correct sequence of system initialization state transitions have occurred.

In some embodiments, the controller 714 can include one or more integrated circuits (ICs) tasked with monitoring one or more portions of the wireless power system for safety. In some embodiments, the controller 714 may be separate from other controllers or computing systems associated with the wireless power receiver. The controller 714 may be an application-specific IC (ASIC) configured to operate according to one or more regulatory standards (e.g., as related to the automotive industry) and, in some instance, monitor one or more signals associated with the wireless power receiver.

In some embodiments, the gate driver system 700b, 700c may receive one or more signals from a power controller (e.g., microcontroller (MCU)) 720. The power controller 720 may be tasked with regulating power to the vehicle battery (e.g., based on a received signal from the voltage regulator 7160. The controller 720 may be configured to generate pulse-width modulation (PWM) signals (e.g., PWMA, PWMB) for controlling the transistor gate(s) (e.g., gates G1, G2 of transistors Q1, Q2 of FIG. 7D).

In some embodiments, the primary side voltage level VPRI of the power supply 704 may be generated by a voltage regulator 716 (e.g., including a DC-DC converter). The voltage regulator may monitor the battery voltage (e.g., of an electric vehicle battery that the wireless power receiver is configured to charge). Voltage VPRI may be used to power controllers 714 and 720. In some embodiments, there may be one or more primary voltage levels depending on the need for different voltage levels (e.g., VPRI_1, VPRI_2, VPRI_3, etc.) by components of the system. These different primary voltage levels may be provided by one or more converters or regulators.

Referring to FIG. 7B, the exemplary power supply 704 is configured to produce a low voltage signal VPRI (e.g., 3.3 V) on its primary side, which is provided to the controller 714, controller 720, and/or pre-drive circuit 702. When the primary voltage VPRI is under a predetermined threshold (e.g., 3 V, 2.5 V, 2 V, 1 V, or less), the pre-drive circuit 702 is configured to generate the under-voltage signal PRI UVLO. The exemplary power supply 704 can be configured to produce a high voltage signal VSEC (e.g., 15 V) on its secondary side, which is provided to the energy storage 706 $C_{E\text{-}BANK}$ (e.g., one or more batteries, one or more capacitors, etc.) and/or capacitor(s) $C_{VSEC}$. In some embodiments, the system 700b, 700c relies upon energy storage 706 in case VSEC decreases or drops out. The secondary voltage VSEC can be provided to a monitor in controller 714 and/or pre-drive circuit 702, e.g., to detect an under-voltage condition. For example, the monitor can compare the voltage level VSEC to a lower threshold (e.g., 15 V, 14 V, 12 V, 10 V, or less). In some embodiments, the monitor in controller 714 can compare the voltage level VSEC to a higher threshold (e.g., 16 V, 18 V, 20 V, or greater).

The exemplary pre-drive circuit 702 can be coupled to (a) a first NOR logic gate 722a configured to receive control signal PWMA and fault signal HW ENABLE and (b) a second NOR logic gate 722b configured to receive control signal PWMB and fault signal HW ENABLE. The pre-drive circuit 702 is configured to receive the outputs of the NOR gates 722a, 722b. The pre-drive circuit 702 and NOR gates 722a, 722b are configured to produce inverted control signals $\overline{\text{PRE-PWMA}}$, $\overline{\text{PRE-PWMB}}$. The pre-drive circuit 702 can be coupled to an AND logic gate 724 configured to receive fault signal HW ENABLE and enable signal SW ENABLE. The pre-drive circuit 702 can be configured to receive the output of the AND gate 724 on the primary low voltage side and output a latch signal LATCH FETS on the secondary high voltage side. The latch signal LATCH FETS is provided as an input to the post-drive circuit 710.

The exemplary inverting post-drive circuit 710 can receive, process, and/or invert the control signals $\overline{\text{PRE-PWMA}}$, $\overline{\text{PRE-PWMB}}$. Therefore, in power transmission mode, the post-drive circuit 710 outputs control signals POST-PWMA, POST-PWMB (plots 906a, 906b) configured to control the switching of gates G1, G2 of circuit 700d (refer to FIG. 9A). In protection mode, the post-drive circuit 710 outputs control signals POST-PWMA, POST-PWMB (plots 908a, 908b) such that gates G1, G2 are latched on (refer to FIG. 9B). The signal LATCH FETS may be configured to enable control signals $\overline{\text{PRE-PWMA}}$, $\overline{\text{PRE-PWMB}}$ to pass through the post-drive circuit 710 to gates G1, G2 when the LATCH FETS is high. When signal LATCH FETS is low, signals POST-PWMA, POST-PWMB can cause the gates G1, G2 to latch high.

FIG. 8 is a logic table 800 of the various signals related to the circuit(s) 700a, gate driver system 700b and 700c, and/or receiver 700d. The logic table 800 can be used to understand the safety operation of the gate driver system 700b, 700c. Note that the left side of the table 800 includes logic inputs 802 and the right side includes logic outputs 804.

In the example scenario of row #14 of the table 800, the logic inputs 802 indicates a fault signal HW ENABLE but does not indicate an enable signal SW ENABLE. In this example, the gates G1, G2 are latched high and no PWM signals (PWMA, PWMB) are produced.

In the example scenario of row #19, the logic inputs 802 indicate no under-voltage conditions (according to inverted signals $\overline{\text{PRIUVLO}}$, $\overline{\text{SECUVLO}}$) and enable signals HW ENABLE, SW ENABLE from the controller 720. Therefore, logic outputs 804 for row #19 include the generation of control signals PWMA, PWMB, thereby enabling the transistors Q1, Q2 to operate in power transmission mode. As can be seen from table 800, the logical combination in rows #16-19 are the sets of signal combinations (as compared to rows #1-15) that enable the PWM signals to be generated for power transmission mode.

Figure 9A:
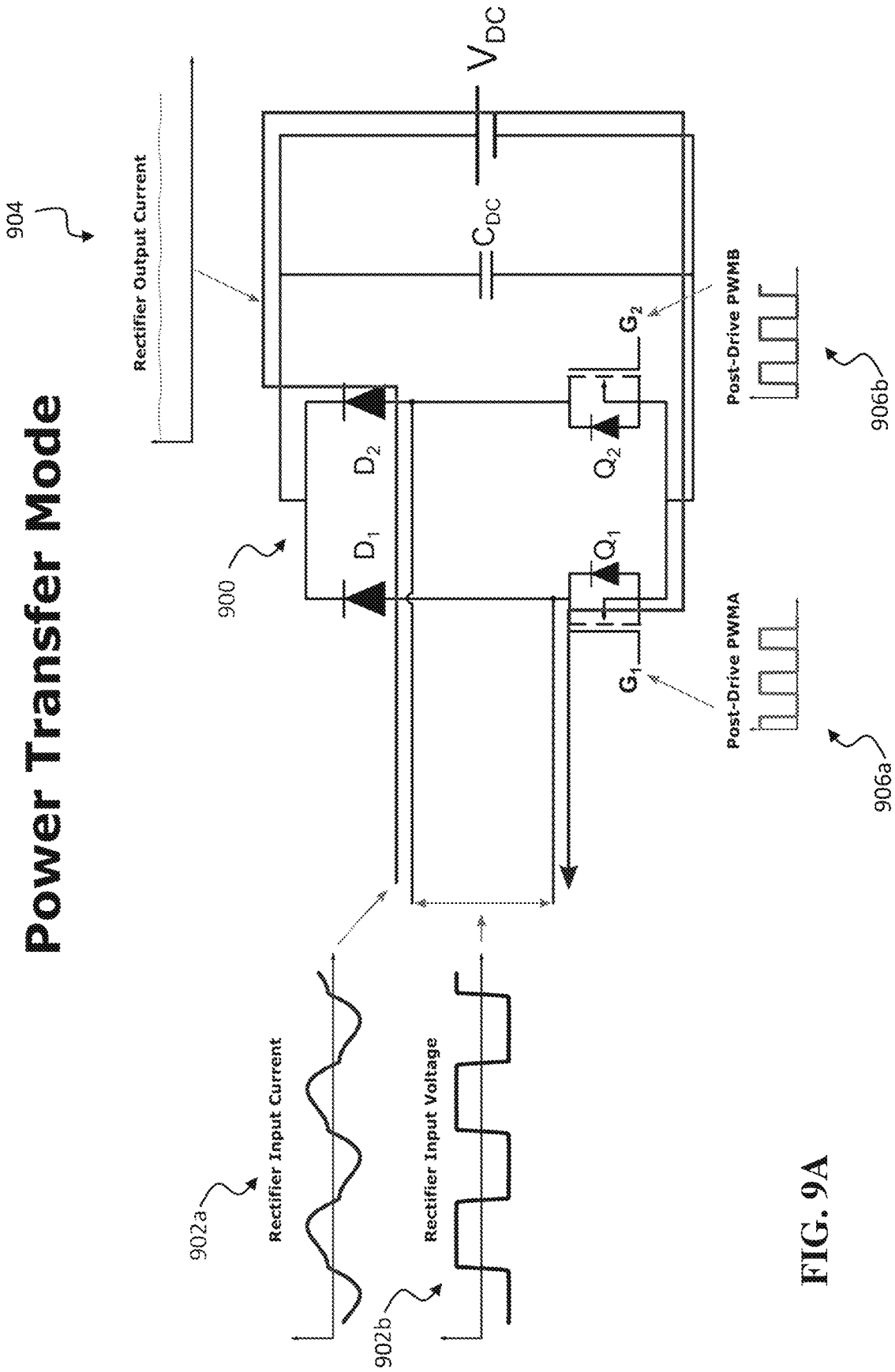
FIGS. 9A-9B illustrates example signals related to the gate driver system of FIGS. 7A-7D in an exemplary rectifier of a wireless power receiver.
Figure 9B:
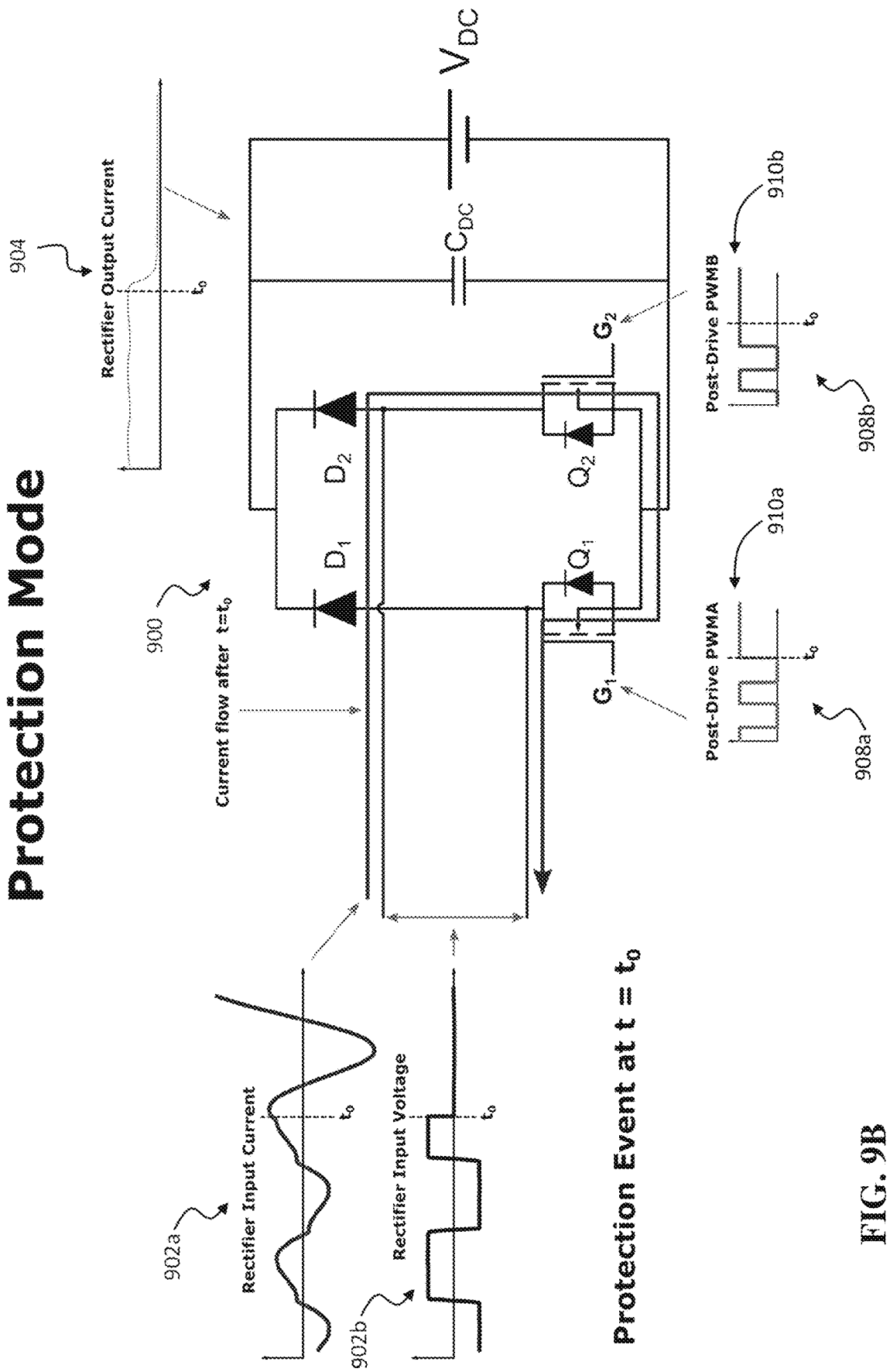

FIGS. 9A-9B illustrate example signals related to the gate driver system 700b, 700c in an exemplary rectifier 900 of a wireless power receiver. FIG. 9A depicts signals during power transmission mode, in which alternating current 902a and alternating voltage 902b are inputted to rectifier 900, resulting in an output current 904 to battery $V_{DC}$. Note that, during power transmission mode, post-drive signals PWMA, PWMB cause the gates G1, G2 to switch states (as indicated by plots 906a, 906b). Therefore, the gates are not in a protection mode. In comparison, in FIG. 9B in protection mode, the post-drive signals PWMA, PWMB of the gate driver are in an on-state (as indicated by plots 908a, 908b). When the transistor gates are held on, the input current is short-circuited through the low-side transistors Q1, Q2, thereby enabling the safety or protection mode. This causes the rectifier output current 904 to drop to zero.

Note that the gate driver(s) implementation and operation described herein can be applied to the gate drivers 204a of transistors 204b of the TMN 206 and/or the gate drivers 208a of transistors 208b of protection circuit 210 at the output of the rectifier 212.

Figure 10:
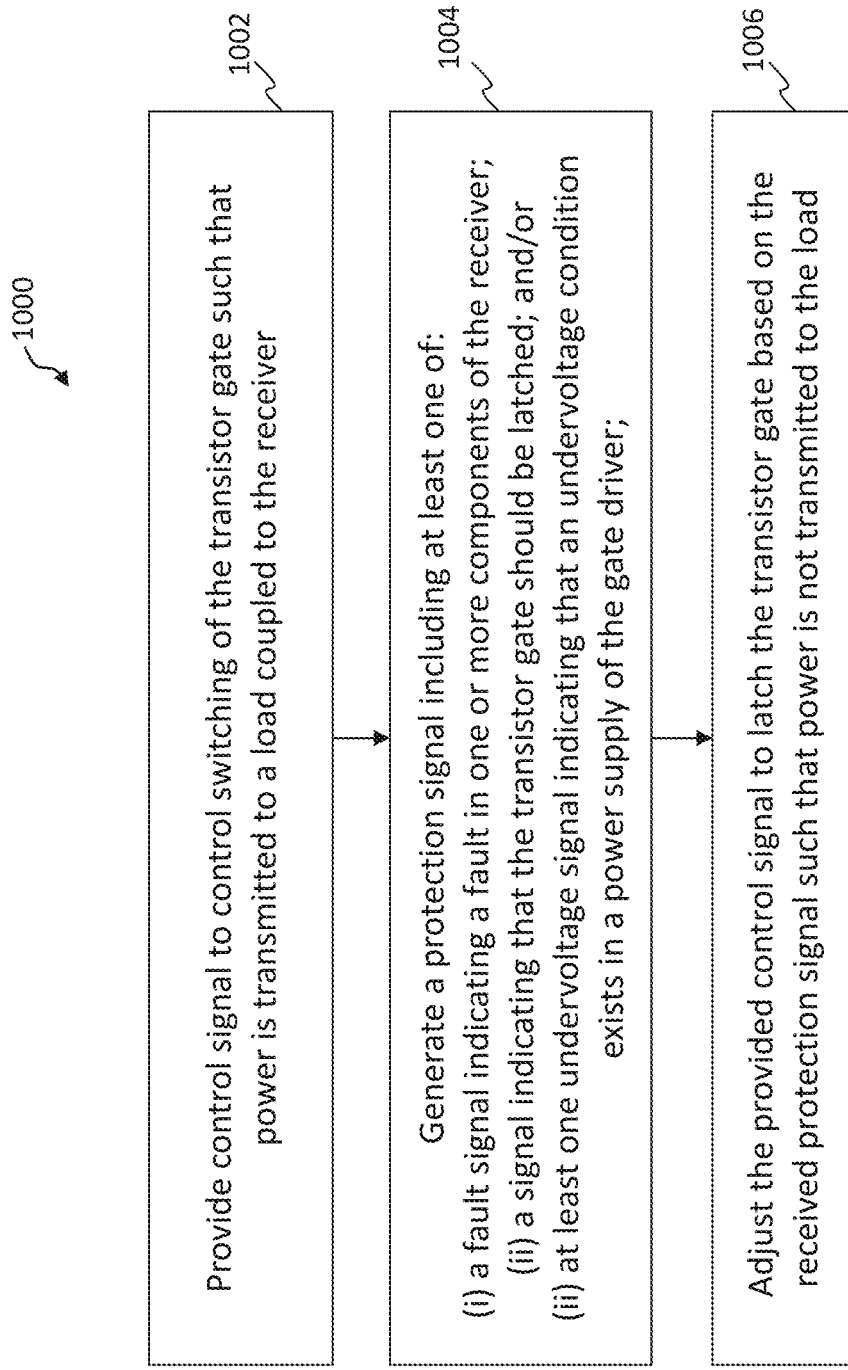
FIG. 10 is a flowchart of an example method for driving transistor gates during protection mode of a wireless power receiver.

FIG. 10 is a flowchart of an example method 1000 for protecting components of the wireless power receiver, as described above. In step 1002, the gate driver (e.g., gate driver system 700b, 700c) can provide one or more control signals (e.g., PWM signals POST-PWMA, POST-PWMB) to control the switching of the transistor gate (e.g., gates G1, G2 of the rectifier (e.g., rectifier 900) in power transmission mode such that power is transmitted to the load (e.g., battery).

In step 1004, a controller (e.g., safety controller 714) coupled to the gate driver can generate a protection signal. The protection signal can include (i) a fault signal indicating a fault in one or more components of the receiver; (ii) an enable signal indicating that the transistor gate (e.g., gate G1 or G2) should be latched; and/or (ii) at least one undervoltage signal indicating that an undervoltage condition exists in a power supply (e.g., supply 704 and/or energy bank 706) of the gate driver.

In step 1006, the gate driver can adjust the control signal to latch the transistor gate based on the received protection signal such that the power is not transmitted to the load. As described in the example embodiment above, the pre-drive circuit 702 of gate driver system 700b, 700c can receive the PWM signals PWMA, PWMB from the power controller 720. The pre-drive circuit 702 may provide signals PRE-PWMA, PRE-PWMB to the post-drive circuit 710, which provides PWM signals POST-PWMA, POST-PWMB to transistor gates G1, G2. Referring to FIG. 9A, during power transmission mode, the PWM signals POST-PWMA, POST-PWMB illustrated in plots 906a, 906b are used to drive the switching of gates G1, G2. In protection mode, the PWM signals POST-PWMA, POST-PWMB are adjusted to latch on the gates G1, G2. Referring to FIG. 9B, plots 908a and 908b illustrate PWM signals POST-PWMA and POST-PWMB, respectively, as staying high (indicated at arrows 910a and 910b, respectively). This causes the latching-on of gates G1 and G2, respectively, and stopping of power transmission to the load. For example, transmitted power can stop directly after the adjustment or can decrease over time. As a result of the latching, the example rectifier output current 904 decreases after time t0 to zero.

Hardware and Software Implementations

Figure 11:
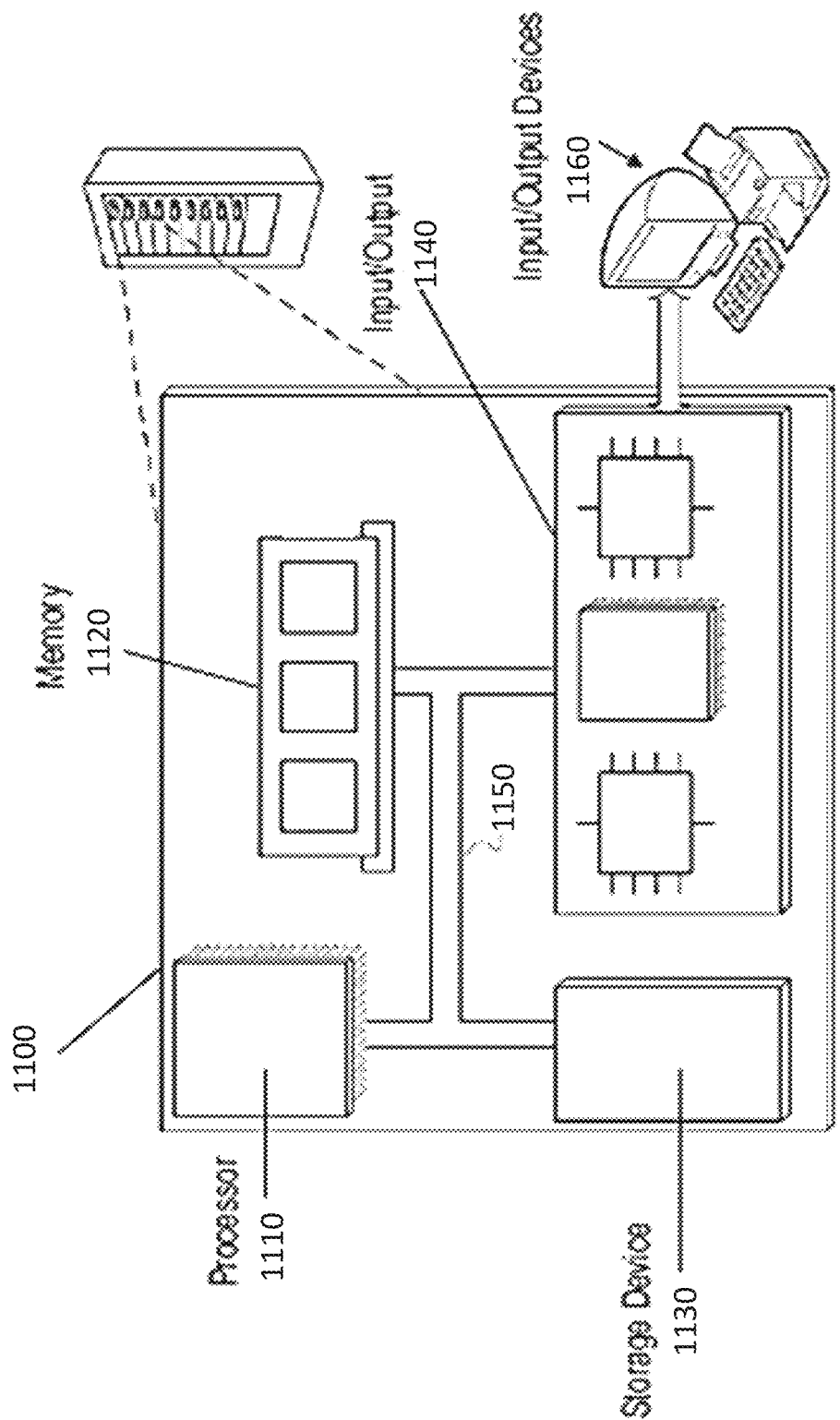
FIG. 11 is a block diagram of an example computer system that may be used in implementing the systems and methods described herein.

FIG. 11 is a block diagram of an example computer system 1100 that may be used in implementing the systems and methods described herein. General-purpose computers, network appliances, mobile devices, or other electronic systems may also include at least portions of the system 1100. The system 1100 includes a processor 1110, a memory 1120, a storage device 1130, and an input/output device 1140. Each of the components 1110, 1120, 1130, and 1140 may be interconnected, for example, using a system bus 1150. The processor 1110 is capable of processing instructions for execution within the system 1100. In some implementations, the processor 1110 is a single-threaded processor. In some implementations, the processor 1110 is a multi-threaded processor. The processor 1110 is capable of processing instructions stored in the memory 1120 or on the storage device 1130.

The memory 1120 stores information within the system 1100. In some implementations, the memory 1120 is a non-transitory computer-readable medium. In some implementations, the memory 1120 is a volatile memory unit. In some implementations, the memory 1120 is a nonvolatile memory unit. In some examples, some or all of the data described above can be stored on a personal computing device, in data storage hosted on one or more centralized computing devices, or via cloud-based storage. In some examples, some data are stored in one location and other data are stored in another location. In some examples, quantum computing can be used. In some examples, functional programming languages can be used. In some examples, electrical memory, such as flash-based memory, can be used.

The storage device 1130 is capable of providing mass storage for the system 1100. In some implementations, the storage device 1130 is a non-transitory computer-readable medium. In various different implementations, the storage device 1130 may include, for example, a hard disk device, an optical disk device, a solid-date drive, a flash drive, or some other large capacity storage device. For example, the storage device may store long-term data (e.g., database data, file system data, etc.). The input/output device 1140 provides input/output operations for the system 1100. In some implementations, the input/output device 1140 may include one or more of a network interface devices, e.g., an Ethernet card, a serial communication device, e.g., an RS-232 port, and/or a wireless interface device, e.g., an 802.11 card, a 3G wireless modem, or a 4G wireless modem. In some implementations, the input/output device may include driver devices configured to receive input data and send output data to other input/output devices, e.g., keyboard, printer and display devices 1160. In some examples, mobile computing devices, mobile communication devices, and other devices may be used.

In some implementations, at least a portion of the approaches described above may be realized by instructions that upon execution cause one or more processing devices to carry out the processes and functions described above. Such instructions may include, for example, interpreted instructions such as script instructions, or executable code, or other instructions stored in a non-transitory computer readable medium. The storage device 1130 may be implemented in a distributed way over a network, such as a server farm or a set of widely distributed servers, or may be implemented in a single computing device.

Although an example processing system has been described in FIG. 11, embodiments of the subject matter, functional operations and processes described in this specification can be implemented in other types of digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible nonvolatile program carrier for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "system" may encompass all kinds of apparatus, devices, and machines for processing data, including by way of example a programmable processor, a computer, or multiple processors or computers. A processing system may include special purpose logic circuitry, e.g., an FPGA (field programmable gate array) or an ASIC (application specific integrated circuit). A processing system may include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a standalone program or as a module, component, subroutine, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Computers suitable for the execution of a computer program can include, by way of example, general or special purpose microprocessors or both, or any other kind of central processing unit. Generally, a central processing unit will receive instructions and data from a read-only memory or a random access memory or both. A computer generally includes a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD-ROM and DVD-ROM disks. The processor and the memory can be supplemented by, or incorporated in, special purpose logic circuitry.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single product or packaged into multiple products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous. Other steps or stages may be provided, or steps or stages may be eliminated, from the described processes. Accordingly, other implementations are within the scope of the following claims.

Terminology

The phraseology and terminology used herein is for the purpose of description and should not be regarded as limiting.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

What is claimed is:

1. A method for protecting one or more components of a wireless power receiver comprising one or more transistors configured to be controlled by respective one or more gate drivers, the gate drivers configured to be powered by an auxiliary power source, the method comprising:
    generating, by a comparator, a signal indicating a comparison of a value of the auxiliary power source to a predetermined threshold;
    triggering a fault latch based on the generated signal, the triggering comprising transmitting a signal to respective inputs of the gate drivers to cause a latched-on state of respective gates of the one or more transistors;
    disconnecting, by one or more switches respectively coupled to the one or more gate drivers, respective outputs of the gate drivers from the respective transistor gates; and
    maintaining, by one or more gate hold-up circuits respectively coupled to the transistor gates, the latched-on state of the respective transistor gates for a period of time.

2. The method of claim 1 wherein the period of time at least partially overlaps with a duration associated with a voltage induced on a resonator of the wireless power receiver.

3. The method of claim 1 wherein the auxiliary power source is a voltage source, and the period of time at least partially overlaps with a duration in which the value of the auxiliary power source is zero volts.

4. The method of claim 1 wherein the one or more gate drivers are configured to drive the respective transistor gates of a tunable matching network of the wireless power receiver.

5. The method of claim 1 wherein the one or more gate drivers are configured to drive the respective transistor gates of a protection circuit coupled to a rectifier input or a rectifier output of the wireless power receiver.

6. The method of claim 1 wherein the value of the auxiliary power source is a voltage value.

7. The method of claim 1 wherein the signal indicates whether the value of the auxiliary power source is above or below the predetermined threshold.

8. The method of claim 1 wherein the one or more gate hold-up circuits each comprise at least one pull-up resistor.

9. The method of claim 1 wherein the one or more gate hold-up circuits each comprise at least one capacitor having a capacitance value based on the period of time.

10. The method of claim 1 wherein the period is 2 seconds or less.

11. A protection circuit for one or more components of a wireless power receiver, the one or more components comprising one or more transistors configured to be controlled by respective gate drivers, the gate drivers configured to be powered by an auxiliary power source, the circuit comprising:
- a comparator configured to generate a signal indicating a comparison of a value of the auxiliary power source to a predetermined threshold;
- a fault latch coupled to the comparator, the fault latch configured to trigger based on the generated signal and transmit a signal to respective inputs of the gate drivers to cause a latched-on state of respective gates of the one or more transistors;
- one or more switches respectively coupled to the one or more gate drivers and configured to disconnect respective outputs of the gate drivers from the respective transistor gates; and
- one or more gate hold-up circuits respectively coupled to the transistor gates and configured to maintain the latched-on state of the respective transistor gates for a period of time.

12. The circuit of claim 11 wherein the period of time at least partially overlaps with a duration associated with a voltage induced on a resonator of the wireless power receiver.

13. The circuit of claim 11 wherein the auxiliary power source is a voltage source, and the period of time at least partially overlaps with a duration in which the value of the auxiliary power source is zero volts.

14. The circuit of claim 11 wherein the one or more gate drivers are configured to drive the one or more respective transistor gates of a tunable matching network of the wireless power receiver.

15. The circuit of claim 11 wherein the one or more gate drivers are configured to drive the one or more respective transistor gates of a protection circuit coupled to a rectifier input or a rectifier output of the wireless power receiver.

16. The circuit of claim 11 wherein the value of the auxiliary power source is a voltage.

17. The circuit of claim 11 wherein the signal indicates whether the value of the auxiliary power source is above or below the predetermined threshold.

18. The circuit of claim 11 wherein the one or more gate hold-up circuits each comprise at least one pull-up resistor.

19. The circuit of claim 11 wherein the one or more gate hold-up circuits each comprise at least one capacitor having a capacitance value based on the period of time.

20. The circuit of claim 12 wherein the period is 2 seconds or greater.

* * * * *